(12) United States Patent
Hwang et al.

(10) Patent No.: US 11,289,418 B2
(45) Date of Patent: Mar. 29, 2022

(54) PACKAGE STRUCTURE AND MANUFACTURING METHOD THEREOF

(71) Applicant: Taiwan Semiconductor Manufacturing Co., Ltd., Hsinchu (TW)

(72) Inventors: Chien-Ling Hwang, Hsinchu (TW); Chun-Lin Lu, Hsinchu (TW); Kai-Chiang Wu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/882,521

(22) Filed: May 24, 2020

(65) Prior Publication Data

US 2020/0286825 A1    Sep. 10, 2020

Related U.S. Application Data

(63) Continuation of application No. 15/939,292, filed on Mar. 29, 2018, now Pat. No. 10,665,537.

(51) Int. Cl.
| | |
|---|---|
| H01L 23/522 | (2006.01) |
| H01L 23/31 | (2006.01) |
| H01L 21/48 | (2006.01) |
| H01L 21/56 | (2006.01) |
| H01L 23/66 | (2006.01) |

(52) U.S. Cl.
CPC ........ *H01L 23/5226* (2013.01); *H01L 21/486* (2013.01); *H01L 21/56* (2013.01); *H01L 23/3121* (2013.01); *H01L 23/66* (2013.01); *H01L 2223/6677* (2013.01)

(58) Field of Classification Search
None
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |

(Continued)

*Primary Examiner* — Nicholas J Tobergte
*Assistant Examiner* — Kien C Ly
(74) *Attorney, Agent, or Firm* — JCIPRNET

(57) ABSTRACT

A package structure includes a redistribution circuit structure, at least one semiconductor die, an insulating encapsulation, insulators, and metallic patterns. The at least one semiconductor die is located on and electrically connected to the redistribution circuit structure. The insulating encapsulation encapsulates the at least one semiconductor die and located on the redistribution circuit structure. The insulators are located on the redistribution circuit structure, wherein the insulators are separated and spaced apart from each other, wherein edges of each of the insulators are distant from edges of the at least one semiconductor die by an offset in a stacking direction of the redistribution circuit structure and the insulating encapsulation. Each of the metallic patterns is located on a respective one of the insulators.

20 Claims, 13 Drawing Sheets

(56) References Cited

U.S. PATENT DOCUMENTS

| | | |
|---|---|---|
| 9,372,206 B2 | 6/2016 | Wu et al. |
| 9,496,189 B2 | 11/2016 | Yu et al. |
| 10,665,537 B2 * | 5/2020 | Hwang ................ H01Q 1/2283 |
| 2019/0221917 A1 * | 7/2019 | Kim .................... H01L 23/5389 |

* cited by examiner

PACKAGE STRUCTURE AND MANUFACTURING METHOD THEREOF

CROSS-REFERENCE TO RELATED APPLICATION

This application is a continuation application of and claims the priority benefit of a prior application Ser. No. 15/939,292, filed on Mar. 29, 2018, now allowed. The entirety of the above-mentioned patent application is hereby incorporated by reference herein and made a part of this specification.

BACKGROUND

Semiconductor devices and integrated circuits are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
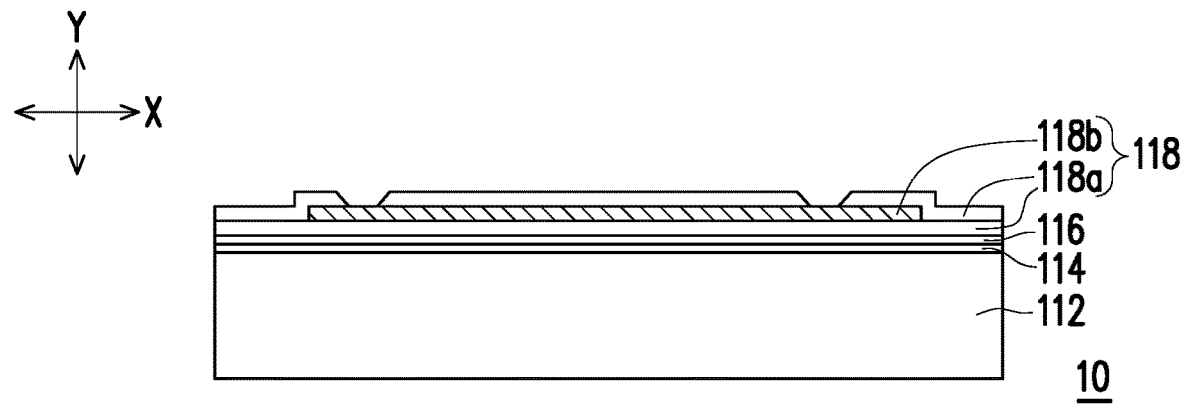
FIG. 1A to FIG. 1J are schematic cross sectional views of various stages in a manufacturing method of a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 7A:
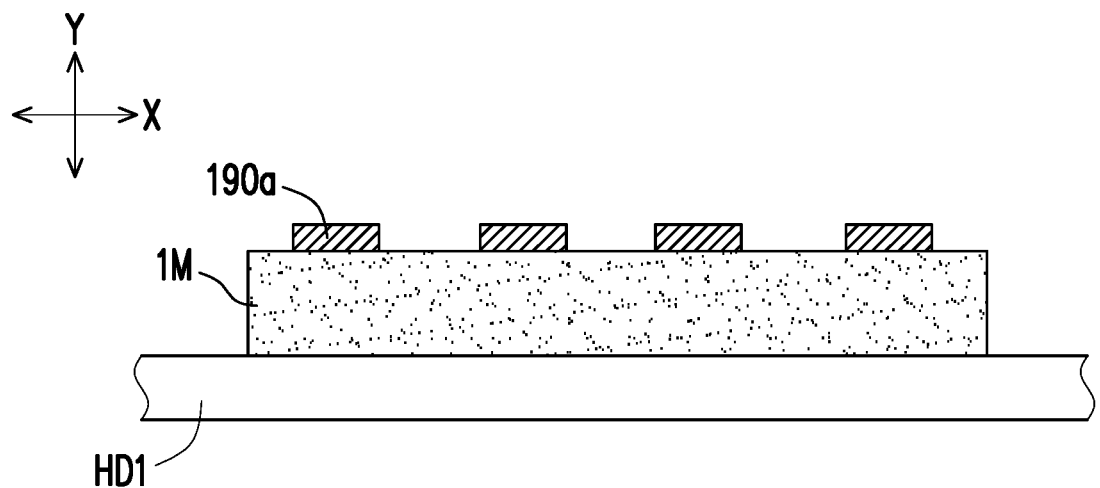
FIG. 7A to FIG. 7B are schematic cross sectional views of various stages in a manufacturing method of antenna elements according to some exemplary embodiments of the present disclosure.
Figure 7B:
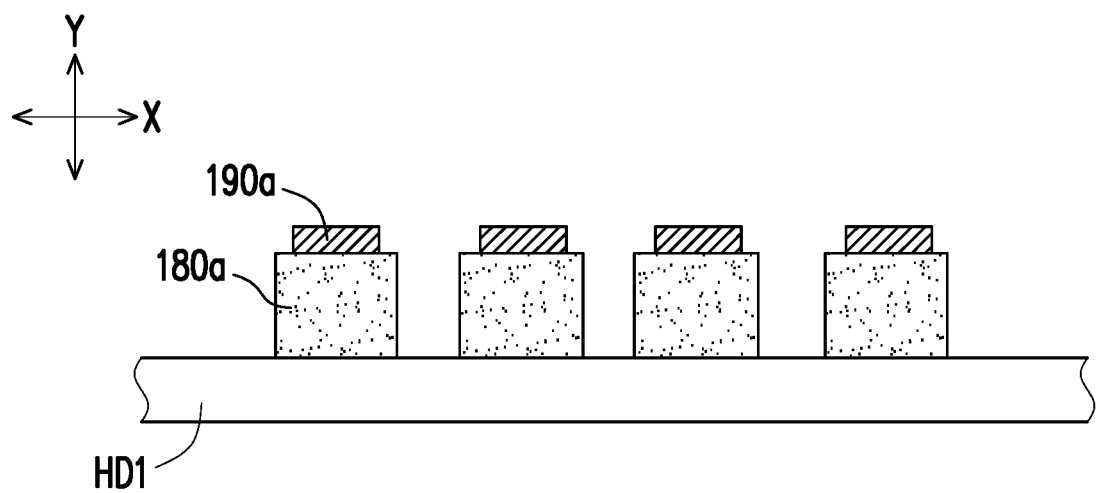
Figure 8:
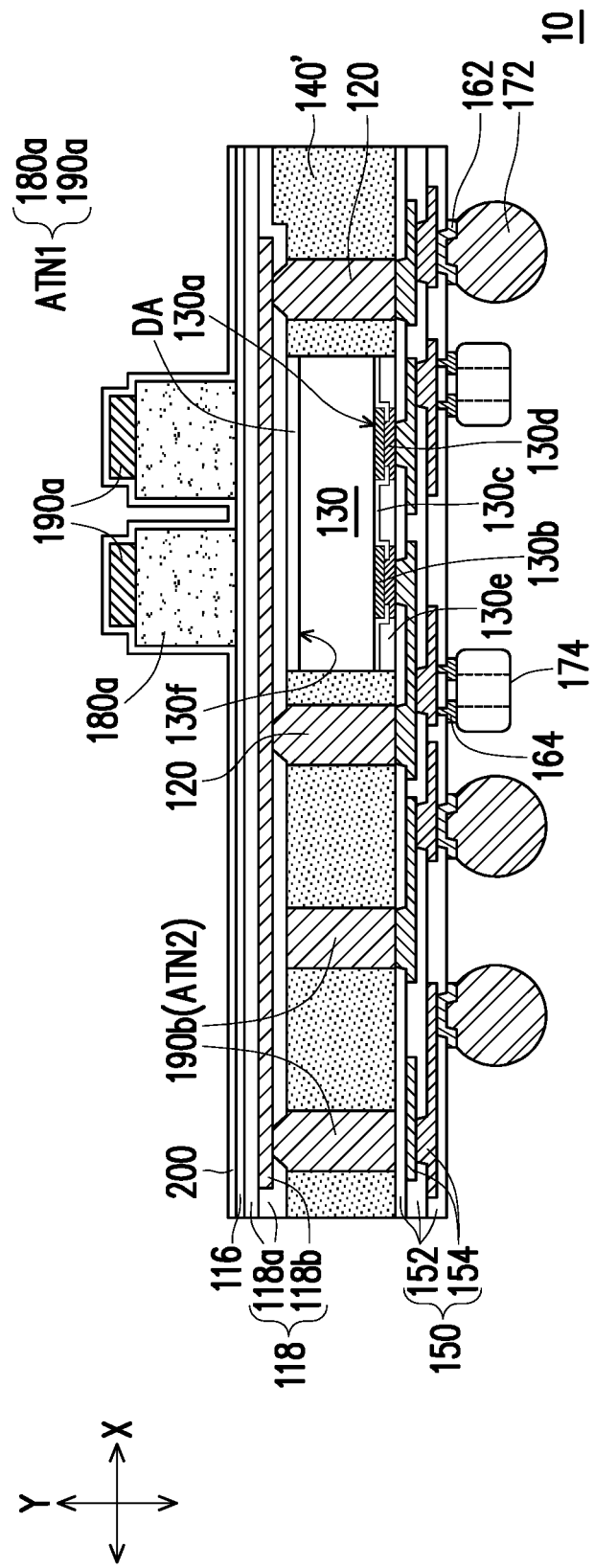
FIG. 8 is a schematic cross sectional view of a package structure according to some exemplary embodiments of the present disclosure.

FIG. 1A to FIG. 1J are schematic cross sectional views of various stages in a manufacturing method of a package structure according to some exemplary embodiments of the present disclosure. FIG. 2 is a schematic top view illustrating a relative position between antenna elements and a semiconductor die of a package structure according to some exemplary embodiments of the present disclosure, where FIG. 1A to FIG. 1J are the schematic cross sectional views taken along a cross sectional line I-I' depicted in FIG. 2. FIG. 7A to FIG. 7B are schematic cross sectional views of various stages in a manufacturing method of antenna elements according to some exemplary embodiments of the present disclosure. FIG. 8 is a schematic cross sectional view of a package structure according to some exemplary embodiments of the present disclosure, where FIG. 8 is the cross sectional view taken along a cross sectional line IV-IV' depicted in FIG. 2. In exemplary embodiments, the manufacturing method is part of a wafer level packaging process. In FIG. 1A to FIG. 1J, one (semiconductor) chip or die is shown to represent plural (semiconductor) chips or dies of the wafer, and a package structure 10 is shown to represent a package structure obtained following the manufacturing method, for example. In other embodiments, two (semiconductor) chips or dies are shown to represent plural (semiconductor) chips or dies of the wafer, and one or more package structures are shown to represent plural (semiconductor) package structures obtained following the (semiconductor) manufacturing method, the disclosure is not limited thereto.

Figure 2:
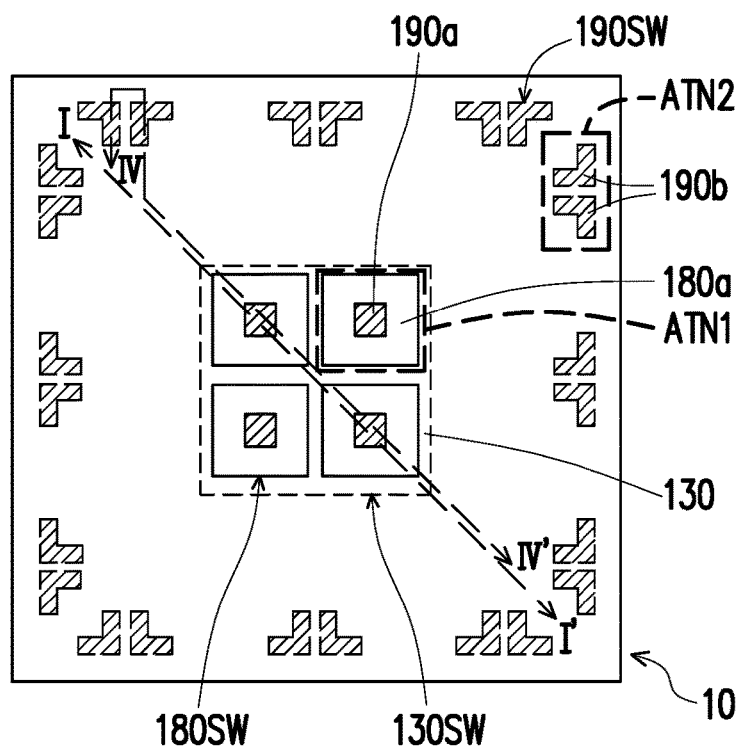
FIG. 2 is a schematic top view illustrating a relative position between antenna elements and a semiconductor die of a package structure according to some exemplary embodiments of the present disclosure.

Referring to FIG. 1A, in some embodiments, a carrier 112 with a debond layer 114 and a buffer layer 116 coated thereon is provided. In one embodiment, the carrier 112 may be a glass carrier or any suitable carrier for carrying a semiconductor wafer or a reconstituted wafer for the manufacturing method of the semiconductor package.

In some embodiments, the debond layer 114 is disposed on the carrier 112, and the material of the debond layer 114 may be any material suitable for bonding and debonding the carrier 112 from the above layer(s) (e.g., the buffer layer 116) or any wafer(s) disposed thereon. In some embodiments, the debond layer 114 may include a release layer (such as a light-to-heat conversion ("LTHC") layer) or an adhesive layer (such as a ultra-violet curable adhesive or a heat curable adhesive layer).

In some embodiments, the buffer layer 116 is disposed on the debond layer 114, and the debond layer 114 is located between the carrier 112 and the buffer layer 116, as shown in FIG. 1A. In some embodiments, the buffer layer 116 may be a dielectric material layer. In some embodiments, the buffer layer 116 may be a polymer layer which made of polyimide, polybenzoxazole (PBO), benzocyclobutene (BCB), or any other suitable polymer-based dielectric material. In some embodiments, the buffer layer 116 may be Ajinomoto Buildup Film (ABF), Solder Resist film (SR), or the like. The top surface of the buffer layer 116 may be levelled and may have a high degree of coplanarity. However, the disclosure is not limited thereto; in an alternative embodiment, the buffer layer is optional and may be omitted.

Continued on FIG. 1A, in some embodiments, a redistribution circuit structure 118 is formed over the carrier 112.

For example, in FIG. 1A, the redistribution circuit structure 118 is formed on the buffer layer 116, and the formation of the redistribution circuit structure 118 includes sequentially forming one or more dielectric layers 118a and one or more metallization layers 118b in alternation. In some embodiments, the redistribution circuit structure 118 includes two dielectric layers 118a and one metallization layer 118b as shown in FIG. 1A, where the metallization layer 118b is sandwiched between the dielectric layers 118a, and portions of a top surface of the metallization layer 118b are respectively exposed by the openings of a topmost layer of the dielectric layers 118a. However, the disclosure is not limited thereto. The numbers of the metallization layers and the dielectric layers included in the redistribution circuit structure 118 is not limited thereto, and may be designated and selected based on the demand. For example, the numbers of the metallization layers and the dielectric layers may be one or more than one.

In certain embodiments, the material of the dielectric layers 118a may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 118a formed by suitable fabrication techniques such as spin-on coating, chemical vapor deposition (CVD), plasma-enhanced chemical vapor deposition (PECVD) or the like. The disclosure is not limited thereto.

In some embodiments, the material of the metallization layer 118b may be made of conductive materials formed by electroplating or deposition, such as aluminum, titanium, copper, nickel, tungsten, and/or alloys thereof, which may be patterned using a photolithography and etching process. In some embodiments, the metallization layer 118b may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 1B:
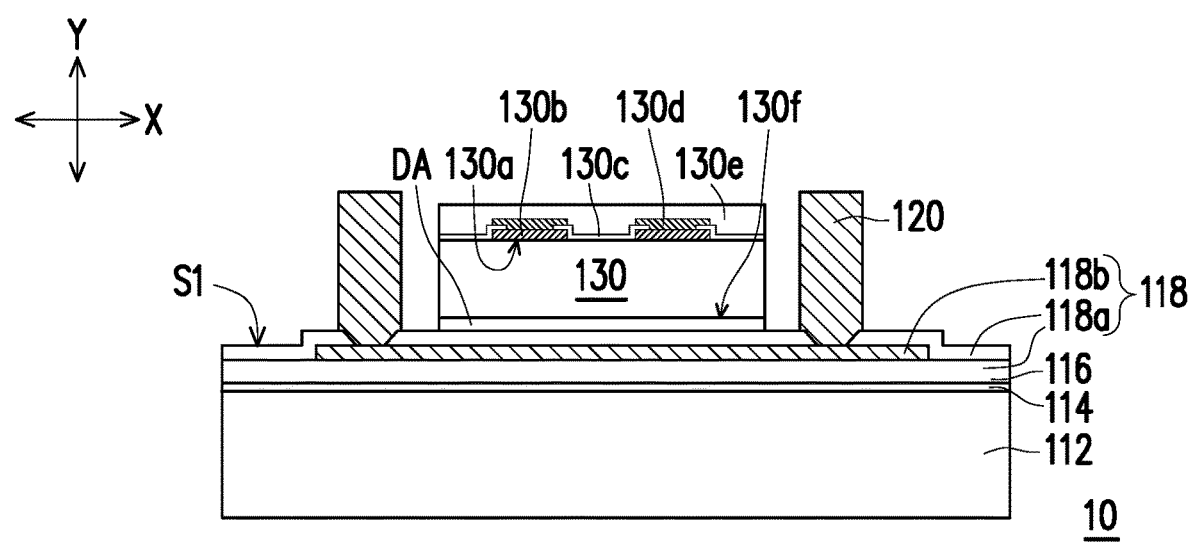

Referring to FIG. 1B, in some embodiments, through vias 120 are formed on the redistribution circuit structure 118. In some embodiments, the through vias 120 may be through integrated fan-out (InFO) vias. For simplification, only two through vias 120 are presented in FIG. 1B for illustrative purposes, however it should be noted that more than two through vias may be formed; the disclosure is not limited thereto. The number of the through vias 120 can be selected based on the demand.

In some embodiments, the through vias 120 are formed by photolithography, plating, photoresist stripping processes or any other suitable method. In one embodiment, the through vias 120 may be formed by forming a mask pattern (not shown) covering the redistribution circuit structure 118 with openings exposing the top surface of the metallization layer 118b exposed by the topmost layer of the dielectric layers 118a, forming a metallic material filling the openings to form the through vias 120 by electroplating or deposition and then removing the mask pattern. In one embodiment, the material of the through vias 120 may include a metal material such as copper or copper alloys, or the like. However, the disclosure is not limited thereto.

Continued on FIG. 1B, in some embodiments, at least one semiconductor die 130 with a connecting film DA disposed thereon is provided, where the semiconductor die 130 has an active surface 130a and a backside surface 130f opposite to the active surface 130a. As shown in FIG. 1B, the semiconductor die 130 is disposed on the redistribution circuit structure 118 and over the carrier 112 through the connecting film DA. In some embodiments, the connecting film DA is located between the semiconductor die 130 and the redistribution circuit structure 118, and the connecting film DA is physically contacts the backside surface 130f of the semiconductor die 130 and the redistribution circuit structure 118 (e.g. the topmost layer of the dielectric layers 118a of the redistribution circuit structure 118). In some embodiments, due to the connecting film DA provided between the semiconductor die 130 and the redistribution circuit structure 118, the semiconductor die 130 and the redistribution circuit structure 118 are stably adhered to each other. In some embodiments, the connecting film DA may be, for example, a semiconductor die attach film, a layer made of adhesives or epoxy resin, or the like. In some embodiments, the redistribution circuit structure 118 is referred as a back-side redistribution layer of the semiconductor die 130.

As shown in FIG. 1B, for example, the through vias 120 are located aside of a location of the semiconductor die 130, and are mechanically and electrically connected to the metallization layer 118b of the redistribution circuit structure 118. In FIG. 1B, a height of the through vias 120 is greater than a height of the at least one semiconductor die 130, for example; however, the disclosure is not limited thereto. In an alternative embodiment, the height of the through vias 120 may be less than or substantially equal to the height of the at least one semiconductor die 130. In one embodiment, the through vias 120 may be formed prior to the formation of the semiconductor die 130. In an alternative embodiment, the through vias 120 may be formed after the formation of the semiconductor die 130. The disclosure is not limited to the disclosure.

In some embodiments, as shown in FIG. 1B, the semiconductor die 130 includes the active surface 130a, a plurality of pads 130b distributed on the active surface 130a, a passivation layer 130c covering the active surface 130a and a portion of the pad 130b, a plurality of conductive pillars 130d connected to the portion of the pads 130b, a protection layer 130e covering the pads 130b and the conductive pillars 130d, and the backside surface 130f opposite to the active surface 130a. The pads 130b are partially exposed by the passivation layer 130c, the conductive pillars 130d are disposed on and electrically connected to the pads 130b, and the protection layer 130e covers the passivation layer 130c and the conductive pillars 130d.

In some embodiments, the pads 130b may be aluminum pads or other suitable metal pads. In some embodiments, the conductive pillars 130d are copper pillars, copper alloy pillar or other suitable metal pillars, for example. In some embodiments, the passivation layer 130c and/or the protection layer 130e may be a polybenzoxazole (PBO) layer, a polyimide (PI) layer or other suitable polymers. In some alternative embodiments, the passivation layer 130c and/or the protection layer 130e may be made of inorganic materials, such as silicon oxide, silicon nitride, silicon oxynitride, or any suitable dielectric material. In certain embodiments, the materials of the passivation layer 130c and the protection layer 130e may be the same or different, the disclosure is not limited thereto.

In an alternative embodiment, the semiconductor die 130 may include the pads 130b distributed on the active surface 130a, the passivation layer 130c covering the active surface 130a and a portion of the pad 130b, the backside surface 130f opposite to the active surface 130a. The disclosure is not limited thereto.

As shown in FIG. 1B, only one semiconductor die is presented for illustrative purposes, however it should be noted that one or more semiconductor dies may be provided. In some embodiments, the semiconductor die 130 described herein may be referred as a chip or an integrated circuit (IC). In some embodiments, the semiconductor die 130 includes at least one wireless and radio frequency (RF) chip. In some embodiments, the semiconductor die 130 may further include additional chip(s) of the same type or different types. For example, in an alternative embodiment, more than one semiconductor die 130 are provided, and the semiconductor dies 130, except for including at least one wireless and RF chip, may include the same or different types of chips selected from digital chips, analog chips or mixed signal chips, application-specific integrated circuit ("ASIC") chips, sensor chips, memory chips, logic chips or voltage regulator chips. In an alternative embodiment, the semiconductor die 130 may be referred as a chip or a IC of combination-type, and the semiconductor die 130 may be a WiFi chip simultaneously including both of a RF chip and a digital chip. The disclosure is not limited thereto.

Figure 1C:
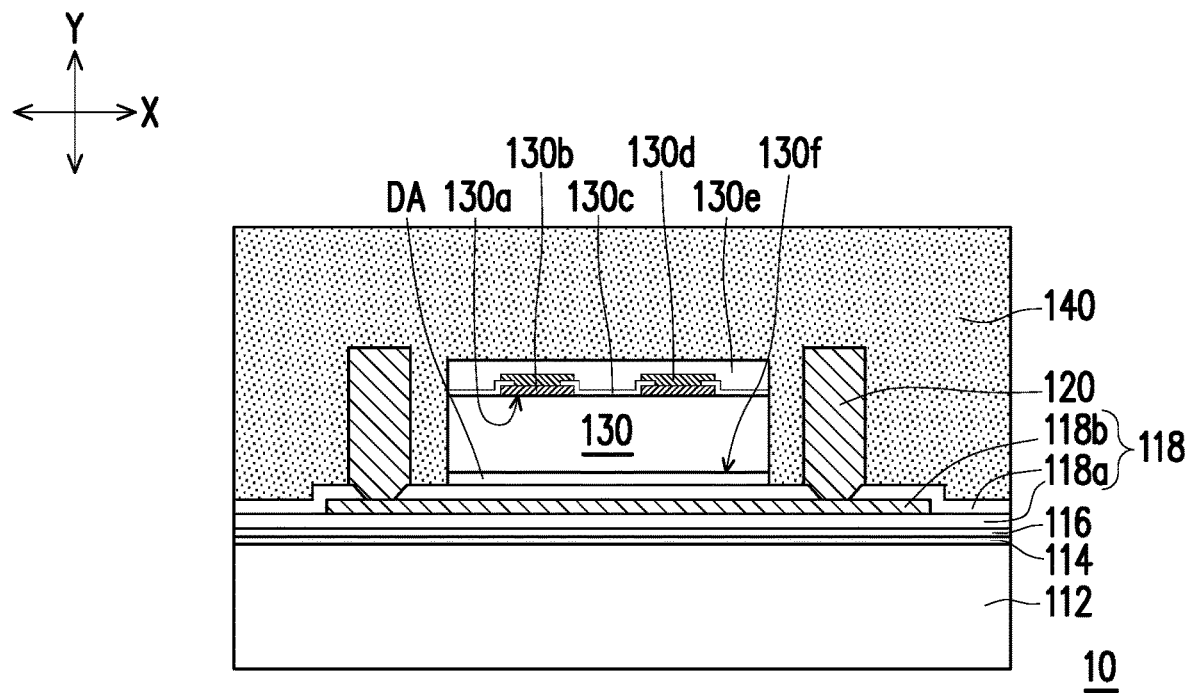

Referring to FIG. 1C, in some embodiments, the through vias 120 and the semiconductor die 130 are encapsulated in an insulating encapsulation 140. In some embodiments, the insulating encapsulation 140 is formed on the redistribution circuit structure 118 and over the carrier 112. As shown in FIG. 1C, the insulating encapsulation 140 at least fills up the gaps between the through vias 120 and between the through vias 120, the semiconductor die 130 and the connecting film DA. In some embodiments, the insulating encapsulation 140 covers the redistribution circuit structure 118 and the connecting film DA. In certain embodiments, as shown in FIG. 1C, the through vias 120 and the semiconductor die 130 are not accessibly revealed by the insulating encapsulation 140.

Figure 1D:
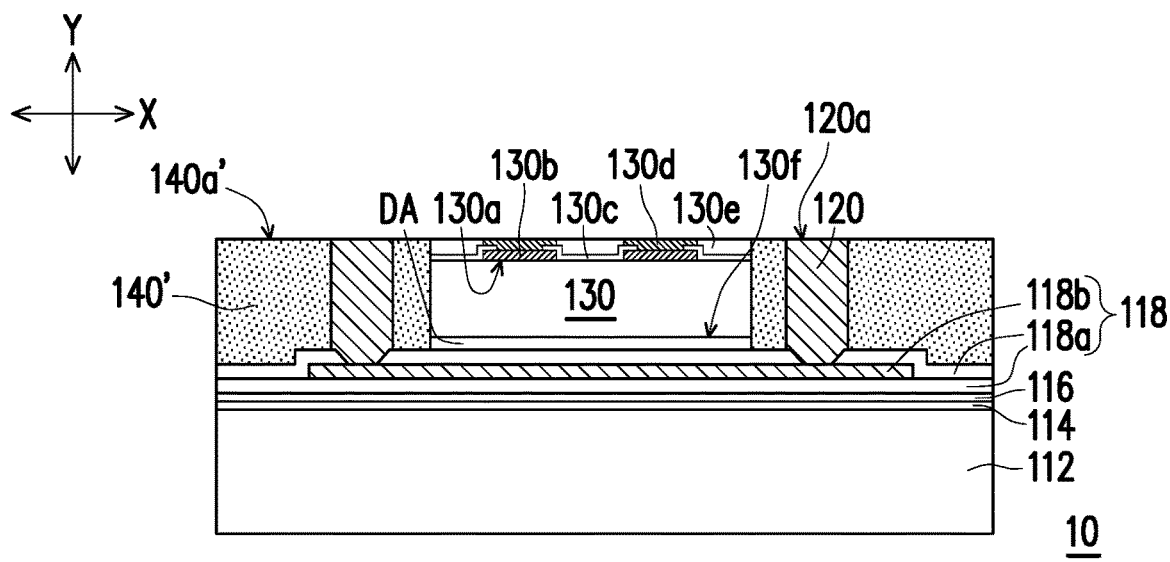

Continued on FIG. 1C, in some embodiments, the insulating encapsulation 140 covers the redistribution circuit structure 118 exposed from the through vias 120 and the semiconductor die 130. In some embodiments, the insulating encapsulation 140 is a molding compound formed by a molding process. In some embodiments, the insulating encapsulation 140, for example, may include polymers (such as epoxy resins, phenolic resins, silicon-containing resins, or other suitable resins), dielectric materials having low permittivity (Dk) and low loss tangent (DO properties, or other suitable materials. In an alternative embodiment, the insulating encapsulation 140 may include an acceptable insulating encapsulation material. In some embodiments, the insulating encapsulation 140 may further include inorganic filler or inorganic compound (e.g. silica, clay, and so on) which can be added therein to optimize coefficient of thermal expansion (CTE) of the insulating encapsulation 140. The disclosure is not limited thereto Referring to FIG. 1D, in some embodiments, the insulating encapsulation 140 is planarized to form an insulating encapsulation 140' exposing the through vias 120 and the semiconductor die 130. In certain embodiments, as shown in FIG. 1D, after the planarization, top surfaces 120a of the through vias 120 and top surfaces of the conductive pillars 130d and the protection layer 130e (of the semiconductor die 130) are exposed by a top surface 140a' of the insulating encapsulation 140'. That is, for example, the top surfaces of the conductive pillars 130d and the protection layer 130e of the semiconductor die 130 and the top surfaces 120a of the through vias 120 become substantially leveled with the top surface 140a' of the insulating encapsulation 140'. In other words, the top surfaces of the conductive pillars 130d and the protection layer 130e of the semiconductor die 130, the top surfaces 120a of the through vias 120, and the top surface 140a' of the insulating encapsulation 140' are substantially coplanar to each other.

The insulating encapsulation 140 may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method.

In some embodiments, during planarizing the insulating encapsulation 140, the conductive pillars 130d and the protection layer 130e of the semiconductor die 130 and the through vias 120 may also be planarized. In certain embodiments, the planarizing step may, for example, performed on the over-molded insulating encapsulation 140 to level the top surface 140a' of the insulating encapsulation 140', the top surfaces 120a of the through vias 120, and the top surfaces of the conductive pillars 130d and the protection layer 130e of the semiconductor die 130.

Figure 1E:
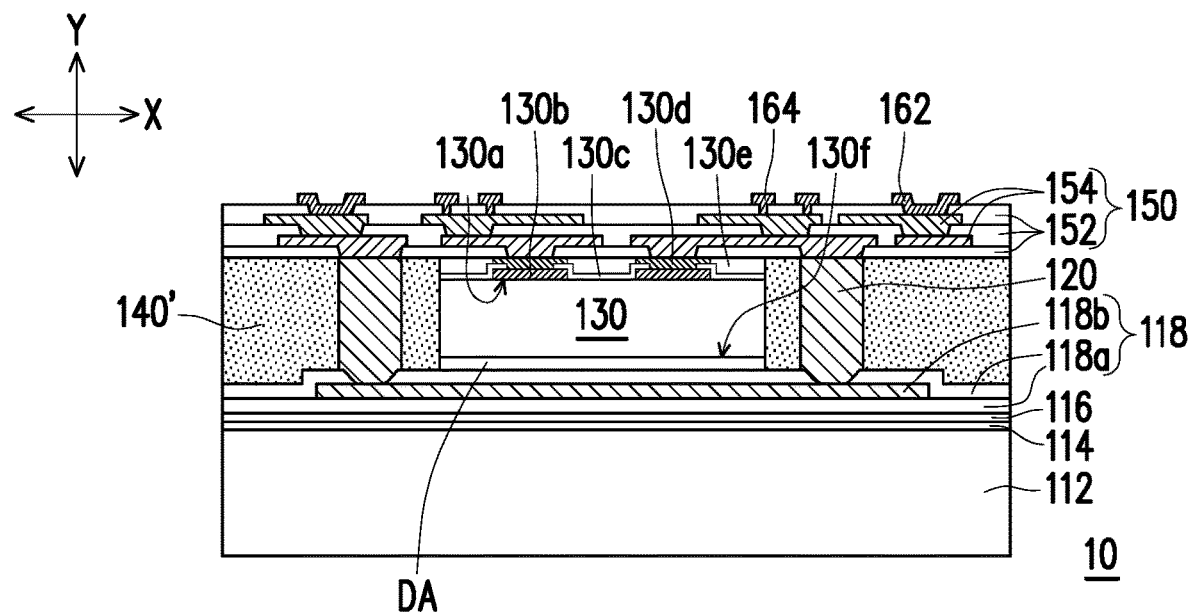

Referring to FIG. 1E, in some embodiments, a redistribution circuit structure 150 is formed on the through vias 120, the semiconductor die 130 and the insulating encapsulation 140'. As shown in FIG. 1E, the redistribution circuit structure 150 is formed on the top surfaces 120a of the through vias 120, the top surfaces of the conductive pillars 130d and the protection layer 130e of the semiconductor die 130 and the top surface 140a' of the insulating encapsulation 140'. In some embodiments, the redistribution circuit structure 150 is electrically connected to the through vias 120, and is electrically connected to the semiconductor die 130 through the conductive pillars 130d. In some embodiments, through the redistribution circuit structure 150, the semiconductor die 130 is electrically connected to the through vias 120. In some embodiments, through the redistribution circuit structure 150 and the through vias 120, the semiconductor die 130 is electrically connected to the redistribution circuit structure 118. As shown in FIG. 1E, for example, the redistribution circuit structure 150 is referred as a front-side redistribution layer of the semiconductor die 130. In some embodiments, as shown in FIG. 1E, the semiconductor die 130 is directly located between the redistribution circuit structure 150 and the connecting film DA, where the through vias 120 and the insulating encapsulation 140' are directly located between the redistribution circuit structure 150 and the redistribution circuit structure 118.

In some embodiments, the formation of the redistribution circuit structure 150 includes sequentially forming one or more dielectric layers 152 and one or more metallization layers 154 in alternation. In certain embodiments, as shown in FIG. 1E, the metallization layers 154 are sandwiched between the dielectric layers 152, where the top surface of a topmost layer of the metallization layers 154 is exposed by a topmost layer of the dielectric layers 152 and the bottom surface of a lowest layer of the metallization layers 154 is exposed by a lowest layer of the dielectric layers 152 to mechanically and electrically connect the through vias 120 and the conductive pillars 130d of the semiconductor die 130.

In some embodiments, the formation of the dielectric layers 152 may be the same as the formation of the dielectric layers 118as, and the formation of the metallization layers 154 may be the same as the formation of the metallization layer 118b, thus is not repeated herein. In an alternative embodiment, the material of the dielectric layers 152 may be the same as or different from the material of the dielectric layers 118a. In an alternative embodiment, the material of the metallization layers 154 may be the same as or different from the material of the metallization layer 118b. The disclosure is not limited thereto. It should be noted that the redistribution circuit structure 150 is not limited to include three dielectric layers and/or two metallization layers. For example, the numbers of the metallization layers and the dielectric layers may be one or more than two. As shown in FIG. 1E, in some embodiments, the redistribution circuit structure 118 and the redistribution circuit structure 150 provide a routing function for the semiconductor die 130.

Continued on FIG. 1E, in some embodiments, a plurality of under-ball metallurgy (UBM) patterns 162 may be disposed on the exposed top surface of the topmost layer of the metallization layers 154 for electrically connecting with conductive elements (e.g. conductive balls), and/or at least one connection pad 164 may be disposed on the exposed top surface of the topmost layer of the metallization layers 154 for electrically connecting with at least one semiconductor elements (e.g., passive components or active components). As shown in FIG. 1E, for example, the UBM patterns 162 and the connection pads 164 are formed on and electrically connected to the redistribution circuit structure 150. In some embodiments, the materials of the UBM patterns 162 and the connection pads 164 may include copper, nickel, titanium, tungsten, or alloys thereof or the like, and may be formed by an electroplating process, for example. In one embodiment, the material of the UBM patterns 162 may be the same as that of the connection pads 164. In another embodiment, the material of the UBM patterns 162 may be different from that of the connection pads 164. In one embodiment, there may be only the UBM patterns 162 presented in the package structure; however, in an alternative embodiment, there may be only the connection pads 164. The numbers of the UBM patterns 162 and the connection pad 164 are not limited in this disclosure, and may be selected based on the design layout.

Figure 1F:
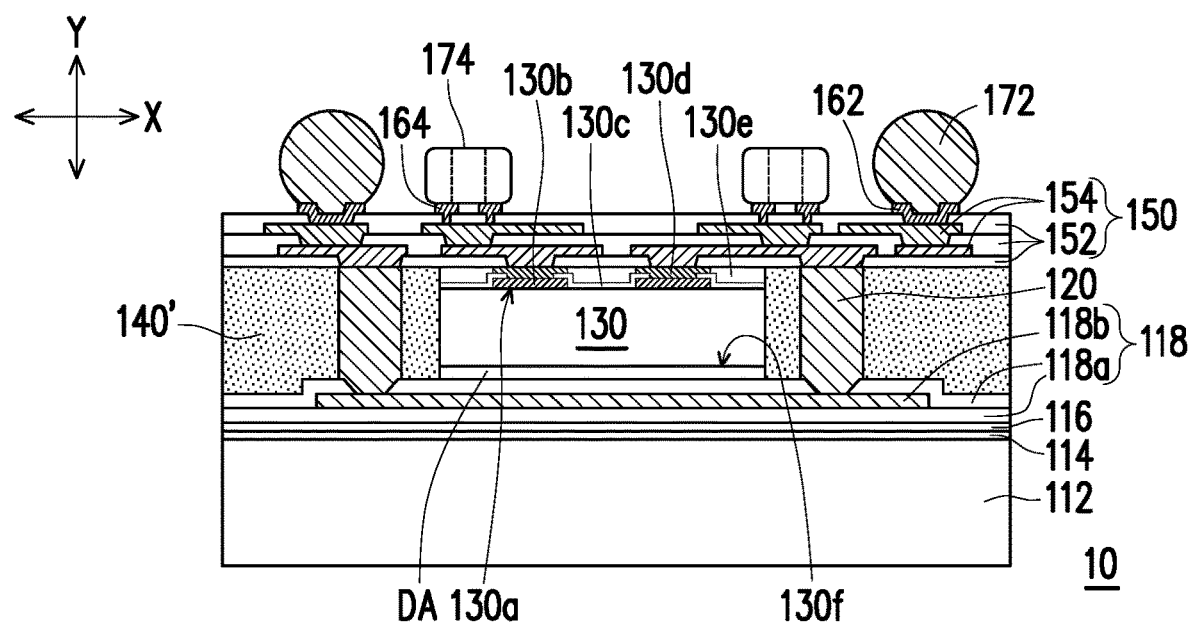

Referring to FIG. 1F, in some embodiments, after the redistribution circuit structure 150 is formed, a plurality of conductive elements 172 are formed on the redistribution circuit structure 150. As shown in FIG. 1F, the conductive elements 172 are disposed on the UBM patterns 162 over the redistribution circuit structure 150. In some embodiments, the conductive elements 172 may be disposed on the UBM patterns 162 by ball placement process or reflow process. In some embodiments, the conductive elements 172 are, for example, solder balls or ball grid array (BGA) balls. In some embodiments, the conductive elements 172 are connected to the redistribution circuit structure 150 through the UBM patterns 162. As shown in the FIG. 1F, some of the conductive elements 172 are electrically connected to the semiconductor die 130 through the UMB patterns 162 and the redistribution circuit structure 150; some of the conductive elements 172 are electrically connected to the through vias 120 through the UMB patterns 162 and the redistribution circuit structure 150; and some of the conductive elements 172 are electrically connected to the redistribution circuit structure 118 through the UMB patterns 162, the redistribution circuit structure 150, and the through vias 120. The number of the conductive elements 172 is not limited to the disclosure, and may be designated and selected based on the number of the UMB patterns 162.

Continued on FIG. 1F, in some embodiments, at least one semiconductor die 174 is provided and disposed on the redistribution circuit structure 150. As shown in FIG. 1F, the semiconductor die 174 is disposed on the connection pads 164, and is connected to the redistribution circuit structure 150 through the connection pads 164. In some embodiments, the semiconductor die 174 may be disposed on the connection pads 164 through reflow process. In some embodiments, the conductive elements 172 and the semiconductor die 174 are formed on a surface of the redistribution circuit structure 150, wherein the redistribution circuit structure 150 is located between the insulating encapsulation 140' and the conductive elements 172 and between the insulating encapsulation 140' and the semiconductor die 174. In some embodiments, as shown in FIG. 1F, the semiconductor die 174 includes a surface mount device (e.g. a passive device, such as, capacitors, resistors, inductors, combinations thereof, or the like). The number of the semiconductor die 174 can be selected based on the number of the connection pad 164. In an alternative embodiment, the semiconductor die 174 may include surface mount devices of the same type or different types, the disclosure is not limited thereto. In alternative embodiments, the semiconductor die 174 are optional, and may be omitted.

Figure 1G:
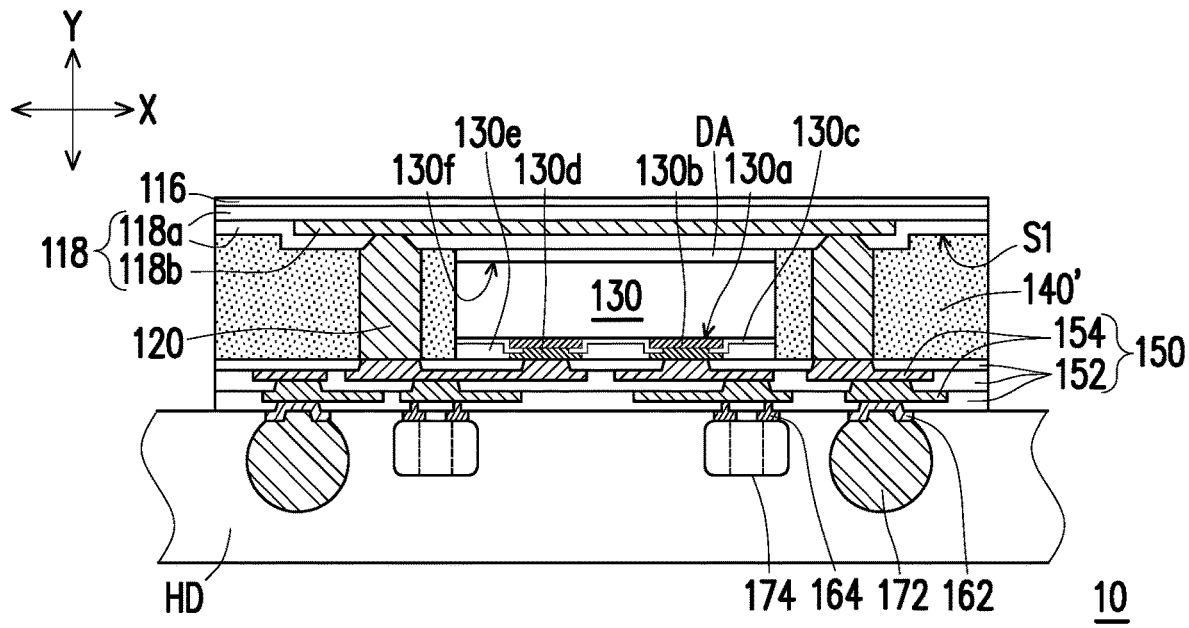

Referring to FIG. 1G, in some embodiments, the whole package structure 10 along with the carrier 112 is flipped (turned upside down), where the conductive elements 172 and the semiconductor die 174 are placed to a holding device HD, and the carrier is then debonded from the buffer layer 116. In some embodiments, the holding device HD includes a polymer film, and the conductive elements 172 and the semiconductor die 174 are mounted into the polymer film as shown in FIG. 1G. For example, the material of the polymer film may include a polymer film having sufficient elasticity to allow the conductive elements 172 and the semiconductor die 174 being embedded therein. In certain embodiments, the holding device HD may be a parafilm or a film made of other suitable soft polymer materials or the like. In an alternative embodiment, the holding device HD may be an adhesive tape, a carrier film or a suction pad. The disclosure is not limited thereto.

Continued on FIG. 1G, in some embodiments, the buffer layer 116 is easily separated from the carrier 112 due to the debond layer 114. In some embodiments, the carrier 112 is detached from the buffer layer 116 through a debonding process, and the carrier 112 and the debond layer 114 are removed. In certain embodiments, the buffer layer 116 is exposed, as show in FIG. 1G. In one embodiment, the debonding process is a laser debonding process. During the debonding step, the holding device HD is used to secure the package structures 10 before debonding the carrier 112 and the debond layer 114. In an alternative embodiment, the buffer layer 116 may be removed from the redistribution circuit structure 118 after debonding the carrier 112 and the debond layer 114.

Figure 1H:
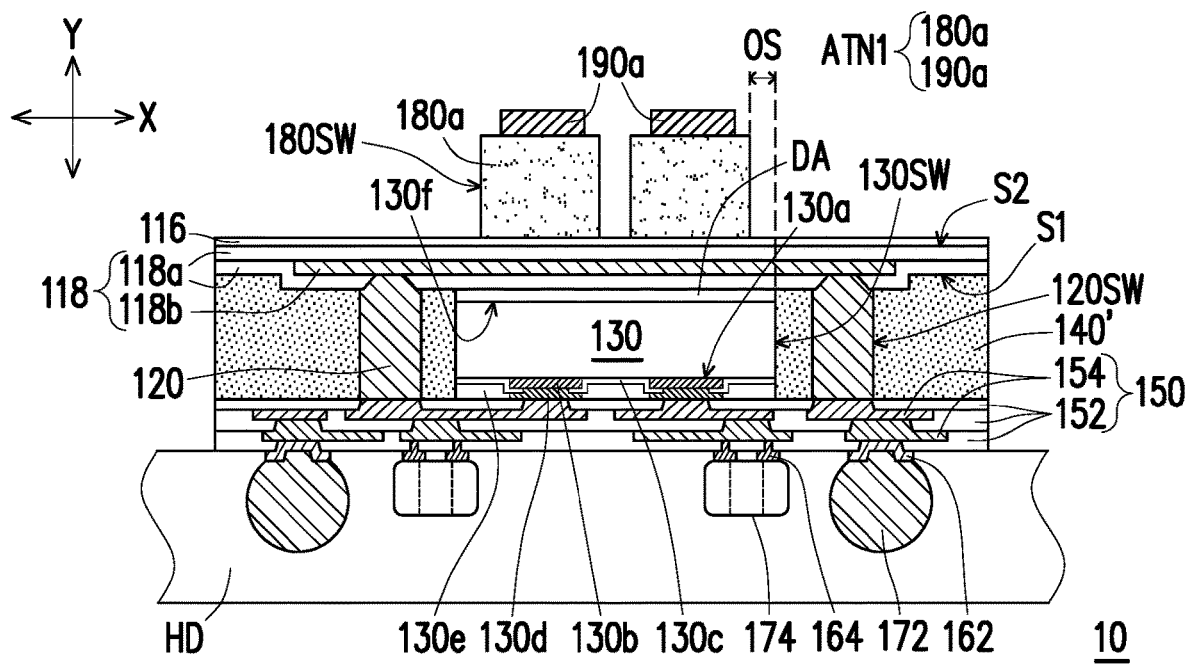

Referring to FIG. 1H, in some embodiments, antenna elements ATN1 are provided and disposed on the redistribution circuit structure 118 (e.g. a second side S2 of the redistribution circuit structure 118), where each of the antenna elements ATN1 includes an insulator 180a and a metallic pattern 190a disposed thereon. For example, as shown in FIG. 1H, the antenna elements ATN1 are disposed on the buffer layer 116, the insulators 180a of the antenna elements ATN1 are located between the metallic patterns 190a of the antenna elements ATN1 and the buffer layer 116, and the buffer layer 116 is located between the insulators 180a and the redistribution circuit structure 118. The number of the antenna elements ATN1 are not limited to the disclosure. In some embodiments, the antenna elements ATN1 are electrically coupled to a portion of the redistribution circuit structure 118, where the portion of the redistribution circuit structure 118 serves as the ground plate and the feed line of the antenna elements ATN1.

In some embodiments, as shown in FIG. 1H, the antenna elements ATN1 are mechanically separated and spaced apart from each other, and portions of the immediately underlying layer (e.g. the buffer layer 116) thereof are exposed and accessibly exposed by a gap between any two of the antenna elements ATN1 (e.g. gaps between any two of the insulators 180a). In the other words, the insulators 180a of the antenna elements ATN1 are mechanically separated and spaced apart from one another, and the metallic patterns 190a of the antenna elements ATN1 are mechanically separated and spaced apart from one another.

In some embodiments, the material of the insulators 180a has low permittivity (Dk) and low loss tangent (Df) properties. Depending on the frequency range of the high-speed applications, suitable materials of the insulators 180a may be selected based on the required electrical properties of the package. Due to the use of the material having the low permittivity (Dk) and low loss tangent (Df) properties, higher gain of the antenna elements ATN1 is obtained. In some embodiments, the material of the insulators 180a and the material of the insulating encapsulation 140' may be the same. In an alternative embodiment, the material of the insulators 180a can be different from the material of the insulating encapsulation 140', the disclosure is not limited thereto. In some embodiment, the material of the metallic patterns 190a includes aluminum, titanium, copper, nickel, tungsten, and/or alloys thereof.

In some embodiments, as shown in the top view of FIG. 2, the shapes of the insulators 180a and the metallic patterns 190a are square, however the disclosure is not limited thereto. In certain embodiments, the shapes of the insulators 180a and the metallic patterns 190a may be round, elliptical, oval, tetragonal, octagonal or any suitable polygonal shape. For example, the shapes of the insulators 180a and the metallic patterns 190a may be the same. For another example, the shape of the insulators 180a may be different from the shape of the metallic patterns 190a. For a further example, the shape of a portion of the insulators 180a may be different from the shape of a portion of the metallic patterns 190a. The disclosure is not limited thereto.

In some embodiments, as shown in FIG. 7A and FIG. 7B, the formation of the antenna elements ATN1 may include forming a dielectric material layer IM over a holding device HD1 (similar to the holding device HD depicted in FIG. 1G) by lamination or the like, disposing the metallic patterns 190a onto the dielectric material layer IM by lamination or the like, and then dicing the dielectric material layer IM into a plurality of individual and separate insulators 180a by mechanical sawing or the like, thereby forming the antenna elements ATN1. As shown in FIG. 7B, one of the metallic patterns 190a is located on a respective one of the insulators 180a. However, the disclosure is not limited thereto.

As shown in FIG. 1H and FIG. 2, in some embodiments, the antenna elements ATN1 are arranged in a matrix form on the redistribution circuit structure 118 within the positioning location of the semiconductor die 130, such as the N×N array or N×M arrays (N, M>0, N may or may not be equal to M). The size of the array for the antenna elements ATN1 can be designated and selected based on the demand, and is not limited to the disclosure. In some embodiment, the antenna elements ATN1 include patch antennas.

In certain embodiments, for each of the antenna elements ATN1, a size of the metallic pattern 190a is less than or substantially equal to a size of the insulator 180a, while a size of the semiconductor die 130 is greater than the size of the insulator 180a (see the top view of FIG. 2 viewing from a stacking direction Y of the redistribution circuit structure 118 and the insulating encapsulation 140'), however the disclosure is not limited thereto. As shown in FIG. 1H and FIG. 2, the edges 180SW of each of the insulators 180a are distant from edges 130SE of the semiconductor die 130 by an offset OS in the stacking direction Y of the redistribution circuit structure 118 and the insulating encapsulation 140', and are distant from edges 120SW of each of the through vias 120 in the stacking direction Y. The edges 180SW of the insulators 180a are referred as the edges of the antenna elements ATN1 in the disclosure, for example. In other words, the edges 180SW of the antenna elements ATN1 are aside of the edges 130SW of the semiconductor die 130 along a direction X perpendicular to the stacking direction Y of the redistribution circuit structure 118 and the insulating encapsulation 140'. Due to such configuration, the stress generated at the edges 130SW of the semiconductor die 130 during thermal processes performed in the manufacture of the package structure 10 may be reduced, and the delamination near the edges 130SW of the semiconductor die 130 is suppressed, thereby the reliability of the package structure 10 is achieved.

In an alternative embodiment, for each of the antenna elements, the size of the metallic pattern is less than or substantially equal to the size of the insulator, while the size of the semiconductor die is less than the size of the insulator. The disclosure is not limited thereto.

In addition, as shown in FIG. 2, in an alternative embodiment, the package structure 10 further includes one or more antenna elements ATN2, and each of the antenna elements ATN2 is constituted by two of through vias 190b located aside of the semiconductor die 130 and the through vias 120 and encapsulated in the insulating encapsulation 140'. The through vias 190b are arranged along the edges of the package structure 10 (see FIG. 2). In one embodiment, as shown in FIG. 8, for the two through vias 190b in each antenna element ATN2, one through via 190b is electrically connected to a part of the redistribution circuit structure 118 or a part of the redistribution circuit structure 150 (one of which serves as a feed line of the antenna element ATN2); and the other through via 190b, which is electrically connected to the other one of a part of the redistribution circuit structure 118 or a part of the redistribution circuit structure 150 and is electrically grounded, serves as a ground plate/line of the antenna element ATN2. In other words, the antenna elements ATN2 are electrically connected to the semiconductor die 130 through the redistribution circuit structure 118 and/or the redistribution circuit structure 150. For example, as shown in FIG. 2, the antenna elements ATN2 are referred as end-fire radiation antennas of horizontal polarization. In some embodiment, the antenna elements ATN2 include dipole antennas.

In some embodiments, the through vias 190b are formed by the method and material similar to the forming method and material of the through vias 120. In one embodiment, the through vias 190b and the through vias 120 are formed in the same processing step. In an alternative embodiment, the through vias 190b and the through vias 120 are formed in different processing steps. The disclosure is not limited thereto. The arrangement and numbers of the antenna elements ATN2 may be adjusted by the demand, the disclosure is not limited to what is illustrated in FIG. 2. Furthermore, owing to the configuration of the antenna elements ATN1 and the antenna elements ATN2, a coverage range of the electromagnetic waves in the package structure 10 is increased, and thus the efficiency of the antenna application of the package structure 10 is enhanced. As shown in FIG. 2, the edges 180SW of each of the insulators 180a are distant from edges 190SW of each of the antenna elements ATN2 in the stacking direction Y.

Figure 1I:
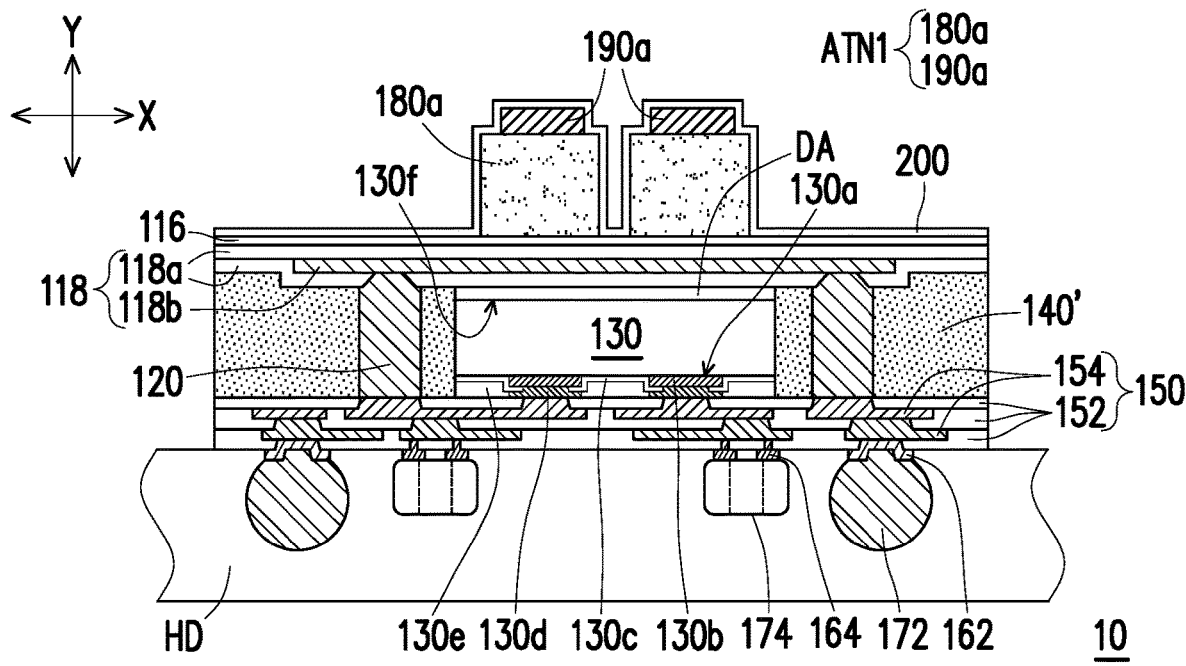

Referring to FIG. 1I, in some embodiments, a protection layer 200 is formed over the antenna elements ATN1 and the buffer layer 116. As shown in FIG. 1I, the protection layer 200 covers the antenna elements ATN1 and the exposed portions of the buffer layer 116, for example. In some embodiments, the material of the protection layer 200 may include polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be formed by suitable fabrication techniques such as deposition, spin-on coating, chemical vapor deposition (CVD), plasma-enhanced chemical vapor deposition (PECVD) or the like. The disclosure is not limited thereto. In one embodiment, the materials of the protection layer 200, the buffer layer 116, the dielectric layers 118a and/or the dielectric layers 152 may be the same. In an alternative embodiment, the material of the protection layer 200 may be different from the materials of the buffer layer 116, the dielectric layers 118a and/or the dielectric layers 152.

Figure 1J:
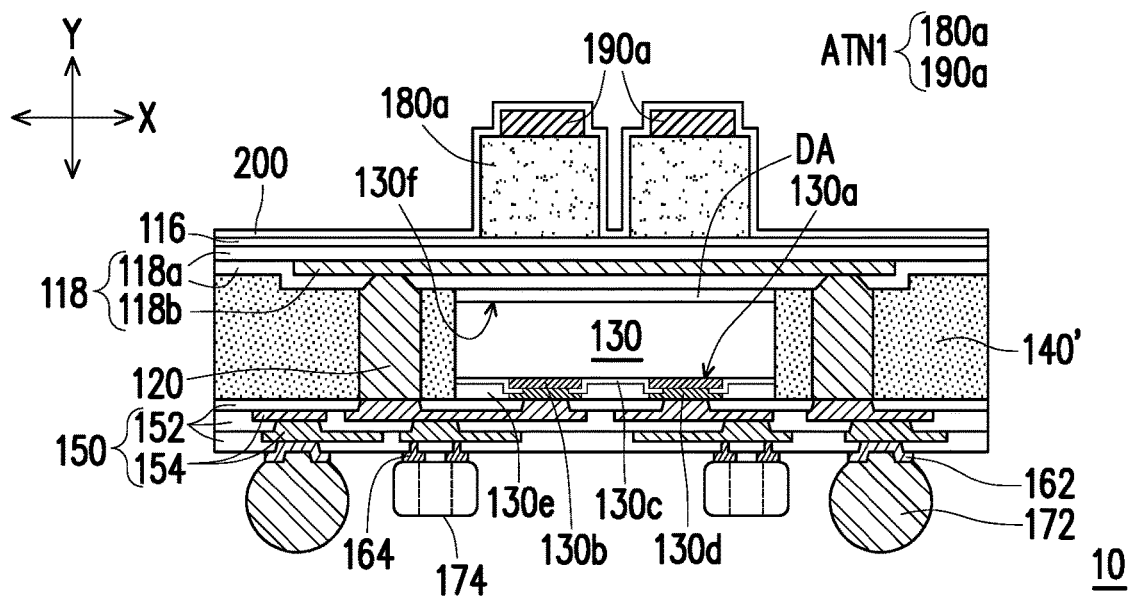

Referring to FIG. 1J, in some embodiments, the conductive elements 172 and the semiconductor die 174 are released from the holding device HD to form the package structure 10, and the redistribution circuit structure 150, the conductive elements 172 and the semiconductor die 174 are exposed. In some embodiments, a dicing process is performed to cut the wafer having a plurality of the package structures 10 into individual and separated package structures 10 before releasing the conductive elements 172 and the semiconductor die 174 from the holding device HD. In one embodiment, the dicing process is a wafer dicing process including mechanical blade sawing or laser cutting. Up to here, the manufacture of the package structure 10 is completed.

In some embodiments, the package structure 10 may be further mounted with an additional package, chips/dies or other electronic devices to form a stacked package structure. For example, the package structure 10 may be further mounted with an additional package, chips/dies or other electronic devices to form the POP structure through the conductive elements 172 and/or other additional connectors based on the demand.

Figure 3:
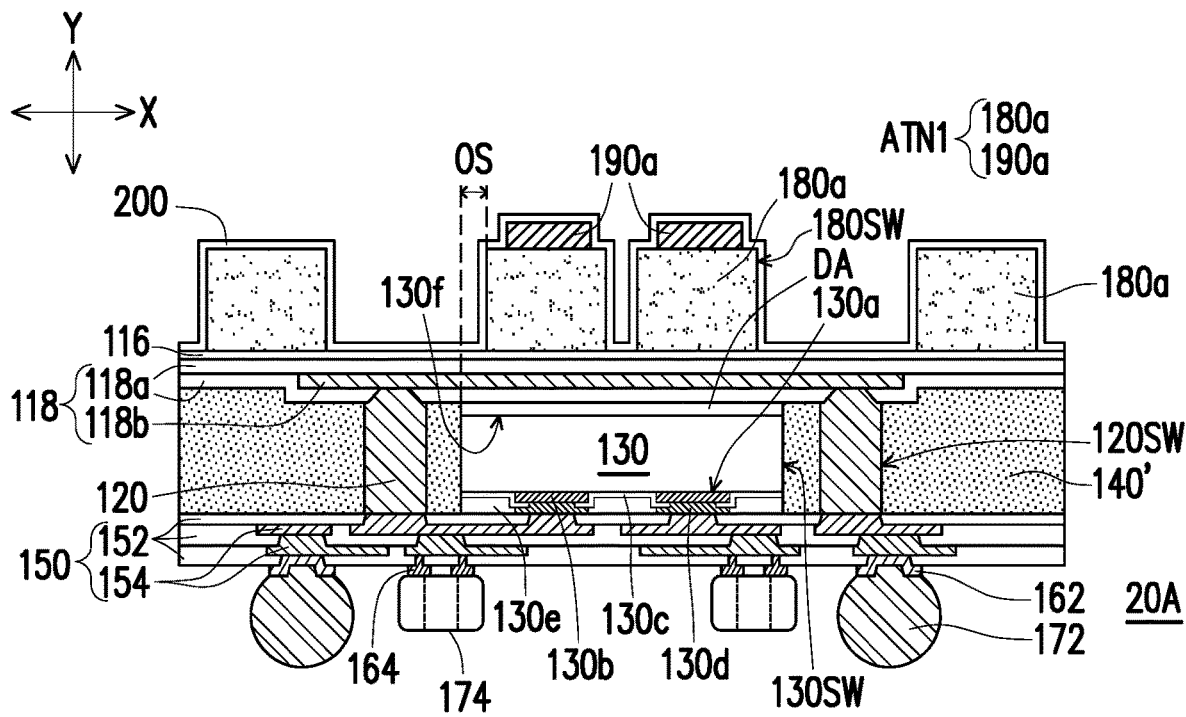
FIG. 3 is a schematic cross sectional view of a package structure according to some exemplary embodiments of the present disclosure.
Figure 4A:
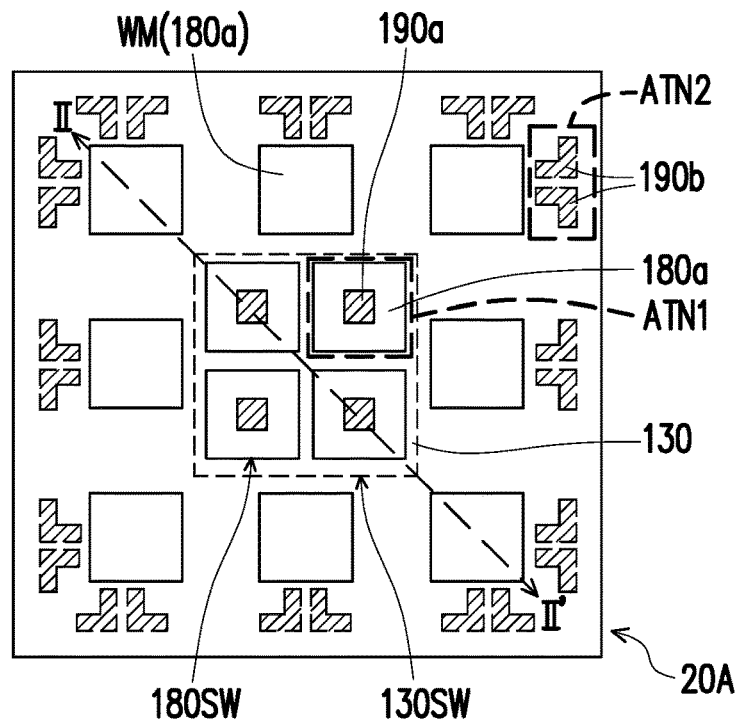
FIG. 4A is a schematic top view illustrating a relative position between antenna elements and a semiconductor die of a package structure according to some exemplary embodiments of the present disclosure.

FIG. 3 is a schematic cross sectional view of a package structure according to some exemplary embodiments of the present disclosure. FIG. 4A is a schematic top view illustrating a relative position between antenna elements and a semiconductor die of a package structure according to some exemplary embodiments of the present disclosure, where FIG. 3 is the schematic cross sectional view taken along a cross sectional line II-II' depicted in FIG. 4. Referring to FIG. 1J and FIG. 3 together, the package structure 10 depicted in FIG. 1J and the FIG. 2 and the package structure 20A depicted in FIG. 3 and FIG. 4A are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 1J and FIG. 3 together, the difference is that, for the package structure 20A depicted in FIG. 3, the package structure 20A further includes an additional element, warpage control elements WM.

In some embodiments, as shown in FIG. 3 and FIG. 4A, each of the warpage control elements WM includes one insulator 180a, where no metallic pattern 190a is disposed on the insulator 180a. In other words, the insulators 180a located on the buffer layer 116 and over the redistribution circuit structure 118, which have no metallic pattern 190a disposed thereon, are referred as the warpage control elements WM in the disclosure. In some embodiments, the number of the insulator 180a is greater than the number of the metallic patterns 190a (FIG. 4). As shown in FIG. 3 and FIG. 4A, the warpage control elements WM are mechanically separated and spaced apart from each other and from the antenna elements ATN1. The number of the warpage control elements WM is not limited the disclosure, and may be determined based on the design layout. Due to the warpage control elements WM, the stress and warpage from the coefficient of CTE mismatch during any thermal process may be performed in the manufacture of the package structure 20A are reduced.

As shown in FIG. 3 and FIG. 4A, the warpage control elements WM and the antenna elements ATN1 are arranged in a form of a matrix on the redistribution circuit structure 118; and in the stacking direction of the redistribution circuit structure 118 and the insulating encapsulation 140', the antenna elements ATN1 are formed in a matrix arrangement on the redistribution circuit structure 118 within a positioning location of the semiconductor die 130 while the warpage control elements WM are formed in a matrix arrangement on the redistribution circuit structure 118 outside the positioning location of the semiconductor die 130. For example, as shown in FIG. 4A, the warpage control elements WM surround the antenna elements ATN1 and are located between the antenna elements ATN1 and the antenna elements ATN2. In some embodiments, the edges of each of the warpage control elements MW are distant from the edges 130SW of the semiconductor die 130 in the stacking direction Y and the edges 120SW of the through vias 120 in the stacking direction Y. As shown in FIG. 4A, the edges of the warpage control elements MW are the edges 180SW of the insulators 180a, for example.

Figure 4B:
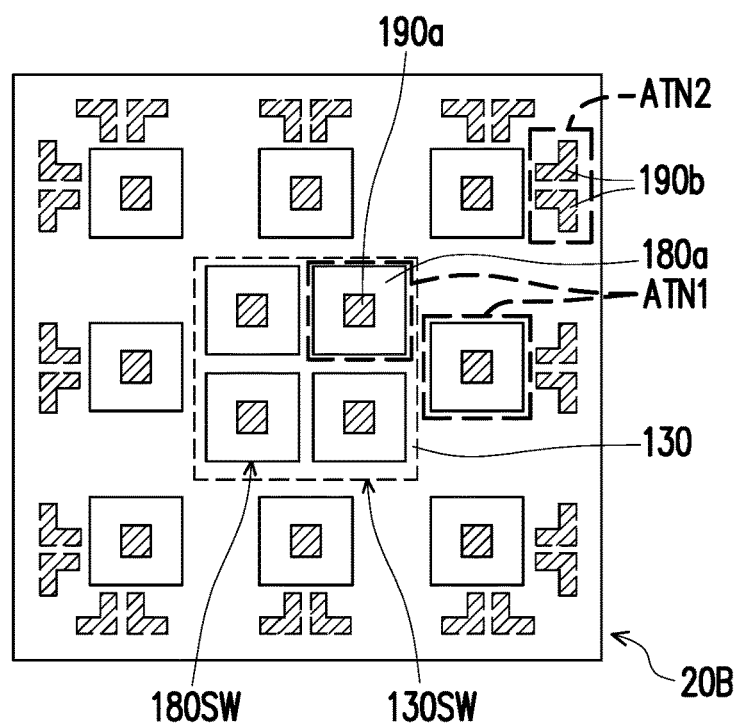
FIG. 4B is a schematic top view illustrating a relative position between antenna elements and a semiconductor die of a package structure according to some exemplary embodiments of the present disclosure.
Figure 4C:
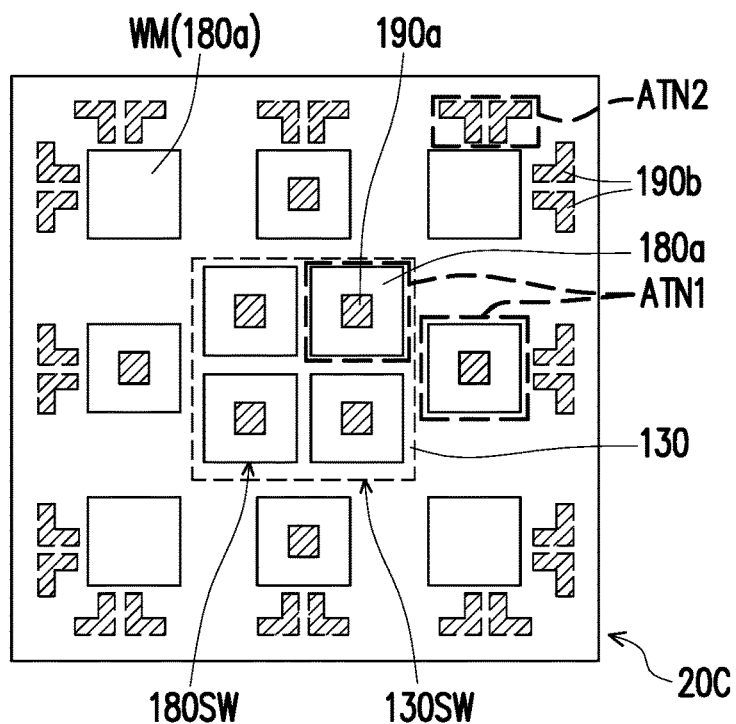
FIG. 4C is a schematic top view illustrating a relative position between antenna elements and a semiconductor die of a package structure according to some exemplary embodiments of the present disclosure.
Figure 4D:
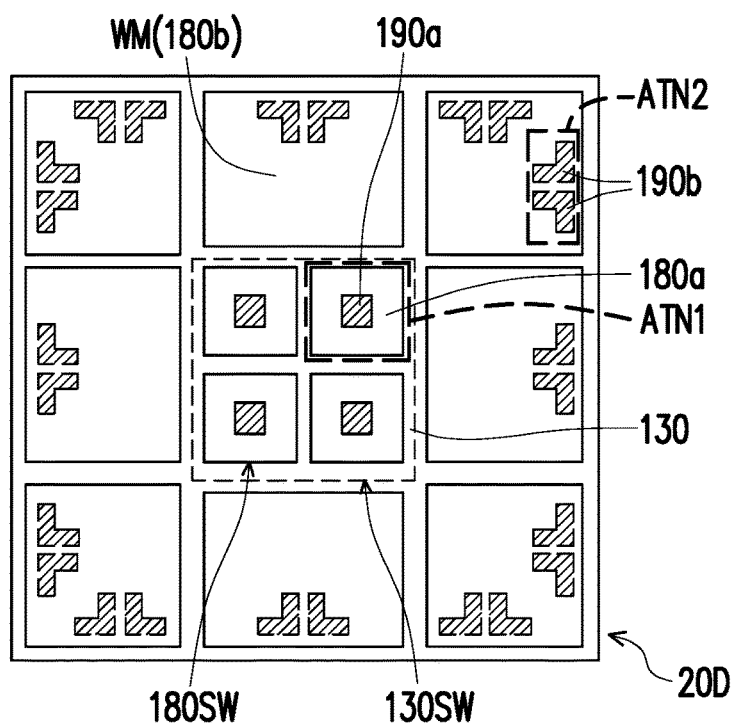
FIG. 4D is a schematic top view illustrating a relative position between antenna elements and a semiconductor die of a package structure according to some exemplary embodiments of the present disclosure.
Figure 4E:
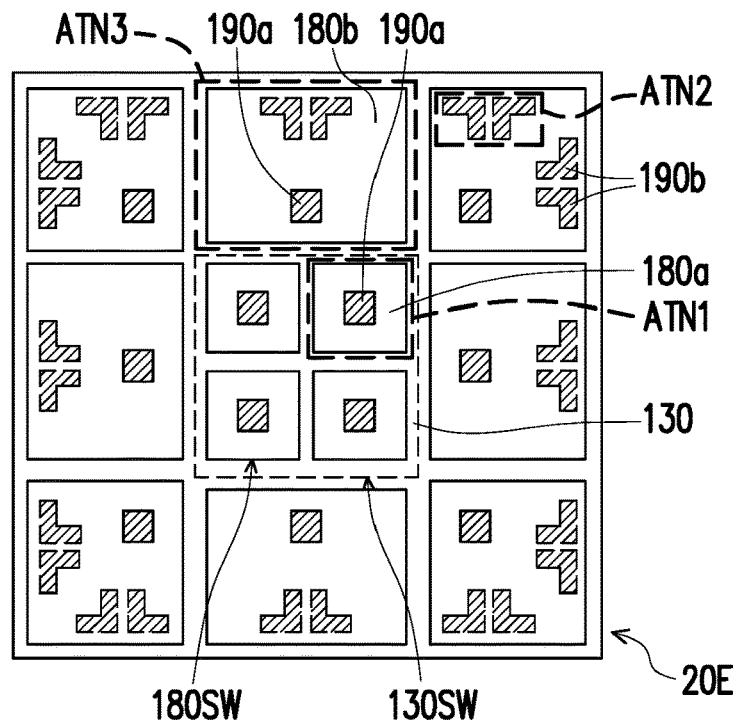
FIG. 4E is a schematic top view illustrating a relative position between antenna elements and a semiconductor die of a package structure according to some exemplary embodiments of the present disclosure.
Figure 4F:
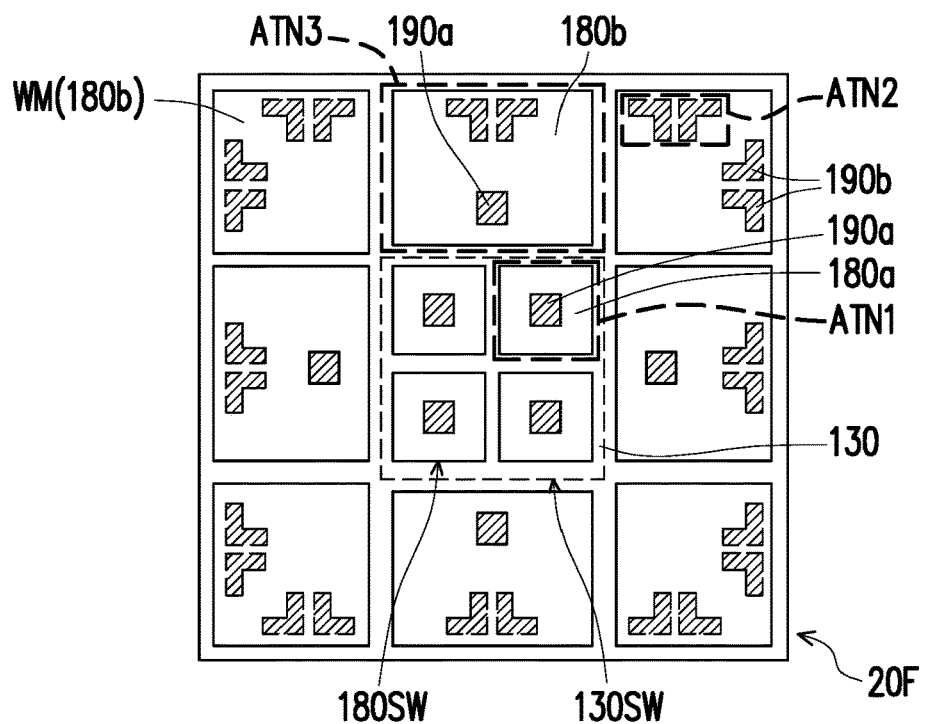
FIG. 4F is a schematic top view illustrating a relative position between antenna elements and a semiconductor die of a package structure according to some exemplary embodiments of the present disclosure.

FIG. 4B to FIG. 4F are schematic top views illustrating a relative position between antenna elements and a semiconductor die of a package structure according to some exemplary embodiments of the present disclosure. Referring to FIG. 4A to FIG. 4F, the package structure 20A depicted in FIG. 4A, the package structure 20B depicted in FIG. 4B, the package structure 20C depicted in FIG. 4C, the package structure 20D depicted in FIG. 4D, the package structure 20E depicted in FIG. 4E, and the package structure 20F depicted in FIG. 4F are similar; such that the elements similar to or substantially the same as the elements described above will use the same reference numbers, and certain details or descriptions of the same elements and the relationship thereof (e.g. the relative positioning configuration and electrical connection) will not be repeated herein.

Referring to FIG. 4A and FIG. 4B together, the difference is that, for the package structure 20B depicted in FIG. 4B, the package structure 20B further includes additional antenna elements ATN1 to replace all of the warpage control elements WM (e.g. the insulators 180a without metallic patterns 190a disposed thereon). As shown in FIG. 4B, in some embodiments, the additional antenna elements ATN1 are formed in a matrix arrangement on the redistribution circuit structure 118 outside the positioning location of the semiconductor die 130 in the stacking direction Y. In other words, for example, the antenna elements ATN1 are distributed over the redistribution circuit structure 118 in a matrix arrangement.

Referring to FIG. 4A and FIG. 4C together, the difference is that, for the package structure 20C depicted in FIG. 4C, the package structure 20C further includes additional antenna elements ATN1 to replace a portion of the warpage control elements WM. As shown in FIG. 4C, in some embodiments, the additional antenna elements ATN1 and the warpage control elements WM are formed in a matrix arrangement on the redistribution circuit structure 118 outside the positioning location of the semiconductor die 130 in the stacking direction Y. In other words, for example, in the package structure 20C depicted in FIG. 4C, a portion of the antenna elements ATN1 is formed in a matrix arrangement on the redistribution circuit structure 118 within the positioning location of the semiconductor die 130 in the stacking direction Y of the redistribution circuit structure 118 and the insulating encapsulation 140', and the other portion of the antenna elements ATN1 and the warpage control elements WM are formed in a matrix arrangement on the redistribution circuit structure 118 outside the positioning location of the semiconductor die 130. In some embodiments, the other portion of the antenna elements ATN1 and the warpage control elements WM formed in a matrix arrangement on the redistribution circuit structure 118 outside the positioning location of the semiconductor die 130 may be arranged in stagger manner.

Referring to FIG. 4A and FIG. 4D together, the difference is that, for the package structure 20D depicted in FIG. 4D, the package structure 20D includes insulators 180b, where a size of the insulators 180b is greater than a size of the insulators 180a. The formation and materials of the insulators 180b is the same as that of the insulators 180a. In an alternative embodiment (not shown), the size of the insulators 180b may be less than the size of the insulators 180a, the disclosure is not limited thereto.

Referring to FIG. 4D and FIG. 4E together, the difference is that, for the package structure 20E depicted in FIG. 4E, the package structure 20E further includes additional antenna elements ATN3 to replace all of the warpage control elements WM (e.g. the insulators 180b without metallic patterns 190a disposed thereon). In some embodiments, each of the antenna elements ATN3 is constituted by one of the insulators 180b and one of the metallic portions 190a. As shown in FIG. 4E, in some embodiments, the antenna elements ATN3 are formed in a matrix arrangement on the redistribution circuit structure 118 outside the positioning location of the semiconductor die 130 in the stacking direction Y. In other words, for example, the antenna elements ATN1 is formed in a matrix arrangement on the redistribution circuit structure 118 within the positioning location of the semiconductor die 130 in the stacking direction Y, and the antenna elements ATN3 are formed in a matrix arrangement on the redistribution circuit structure 118 outside the positioning location of the semiconductor die 130. In some embodiments, as shown in FIG. 4E, the antenna elements ATN3 surround the antenna elements ATN1. In some embodiments, the antenna elements ATN3 is electrically coupled to a portion of the redistribution circuit structure 118, where the portion of the redistribution circuit structure 118 serves as a ground plate/feed line of the antenna elements ATN3. In some embodiment, the antenna elements ATN3 include patch antennas. Owing to the configuration of the antenna elements ATN1, the antenna elements ATN2 and the antenna elements ATN3, a coverage range of the electromagnetic waves in the package structure 20E is increased, and thus the efficiency of the antenna application of the package structure 20E is enhanced.

Referring to FIG. 4D and FIG. 4F together, the difference is that, for the package structure 20F depicted in FIG. 4F, the package structure 20F further includes additional antenna elements ATN3 to replace a portion of the warpage control elements WM. In some embodiments, the antenna elements ATN3 and the warpage control elements WM are formed in a matrix arrangement on the redistribution circuit structure 118 outside the positioning location of the semiconductor die 130 in the stacking direction Y. In certain embodiments, as shown in FIG. 4F, the antenna elements ATN1 is formed in a matrix arrangement on the redistribution circuit structure 118 within the positioning location of the semiconductor die 130 in the stacking direction Y, and the antenna elements ATN3 and the warpage control elements WM are formed in a matrix arrangement on the redistribution circuit structure 118 outside the positioning location of the semiconductor die 130.

Figure 5A:
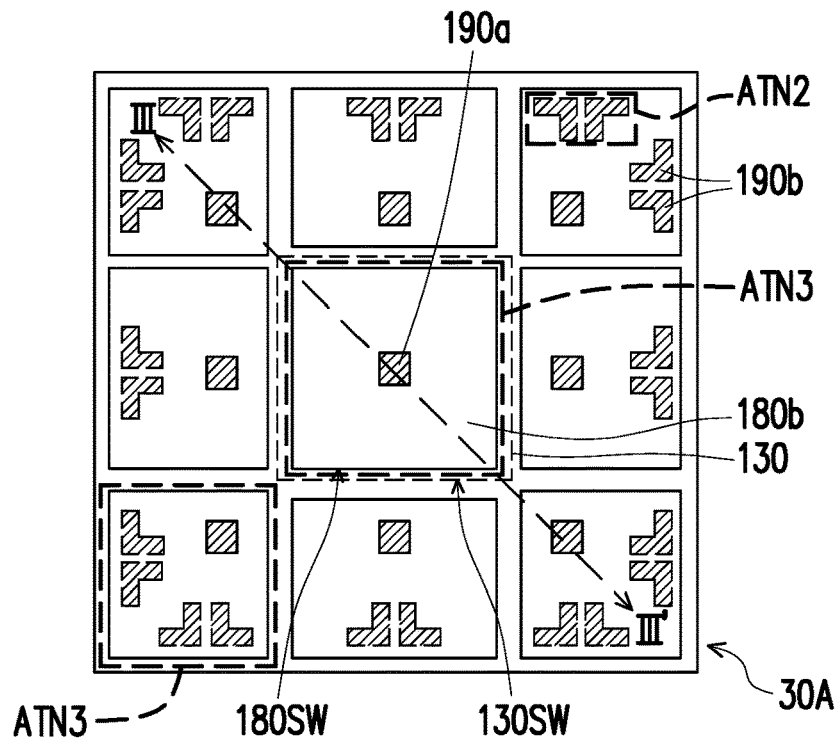
FIG. 5A is a schematic top view illustrating a relative position between antenna elements and a semiconductor die of a package structure according to some exemplary embodiments of the present disclosure.
Figure 5B:
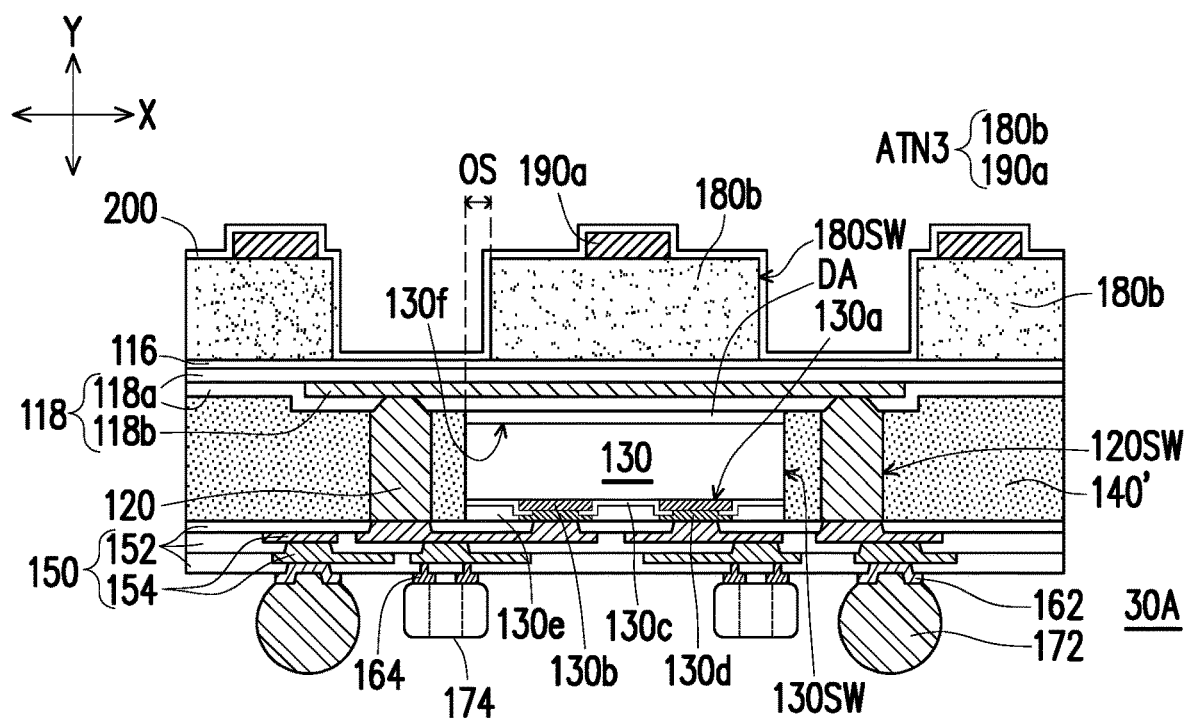
FIG. 5B is a schematic cross sectional view of a package structure according to some exemplary embodiments of the present disclosure.
Figure 5C:
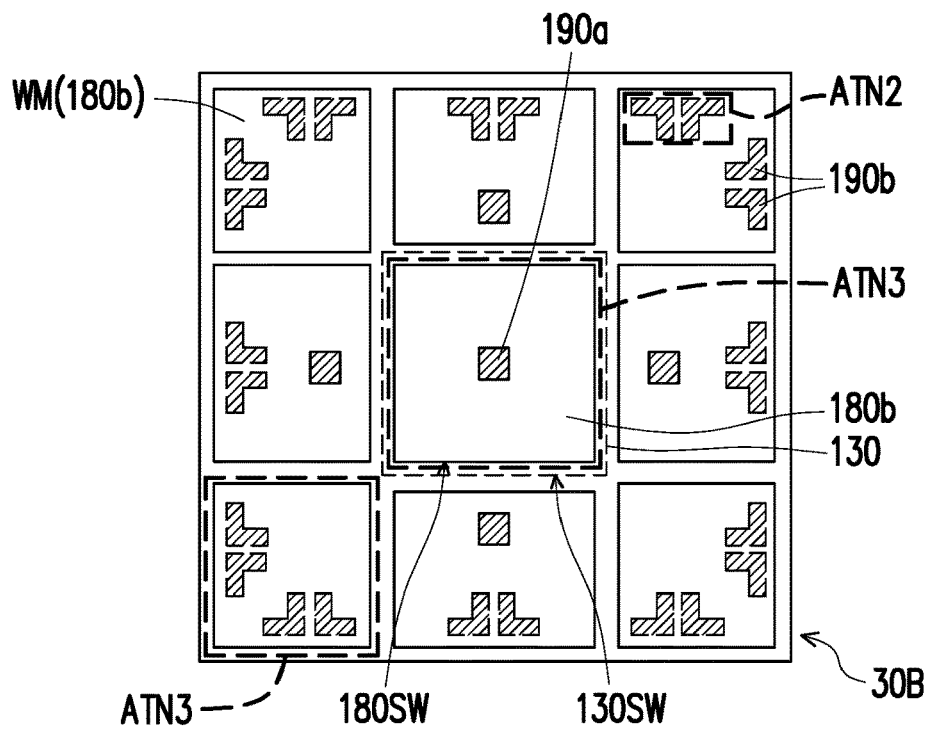
FIG. 5C is a schematic top view illustrating a relative position between antenna elements and a semiconductor die of a package structure according to some exemplary embodiments of the present disclosure.

FIG. 5A is a schematic top view illustrating a relative position between antenna elements and a semiconductor die of a package structure according to some exemplary embodiments of the present disclosure. FIG. 5B is a schematic cross sectional view of a package structure according to some exemplary embodiments of the present disclosure, where FIG. 5B is the schematic cross sectional views taken along a cross sectional line III-III' depicted in FIG. 5A. FIG. 5C is a schematic top view illustrating a relative position between antenna elements and a semiconductor die of a package structure according to some exemplary embodiments of the present disclosure.

Referring to FIG. 4E and FIG. 5A, the package structure 20E depicted in FIG. 4E and the package structure 30A depicted in FIG. 5A are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 4E and FIG. 5A together, the difference is that, for the package structure 30A depicted in FIG. 5A, the package structure 30A has the antenna element ATN3 disposed on the redistribution circuit structure 118 within the positioning location of the semiconductor die 130 in the stacking direction Y.

Referring to FIG. 5A and FIG. 5B, in some embodiments, the edges 180SW of the antenna elements ATN3 disposed on the redistribution circuit structure 118 within the positioning location of the semiconductor die 130 in the stacking direction Y are distant from the edges 130SE of the semiconductor die 130 by the offset OS in the stacking direction Y of the redistribution circuit structure 118 and the insulating encapsulation 140', and are distant from the edges 120SW of each of the through vias 120 in the stacking direction Y. In other words, the edges 180SW of the antenna elements ATN3 are aside of the edges 130SW of the semiconductor die 130 along a direction X perpendicular to the stacking direction Y of the redistribution circuit structure 118 and the insulating encapsulation 140'. Due to such configuration, the stress generated at the edges 130SW of the semiconductor die 130 during thermal processes performed in the manufacture of the package structure 30A may be reduced, and the delamination near the edges 130SW of the semiconductor die 130 is suppressed, thereby the reliability of the package structure 30A is achieved.

In addition, in some embodiments, for the package structures 20B, 20C, 20D and 20F of the disclosure, the antenna elements ATN1 disposed on the redistribution circuit structure 118 within the positioning location of the semiconductor die 130 may all be replaced with one antenna element ATN3. For example, the antenna elements ATN1 disposed on the redistribution circuit structure 118 within the positioning location of the semiconductor die 130 in the package structure 20F of FIG. 4F are replaced with the antenna element ATN3 to form the package structure 30B depicted in FIG. 5C.

Figure 6:
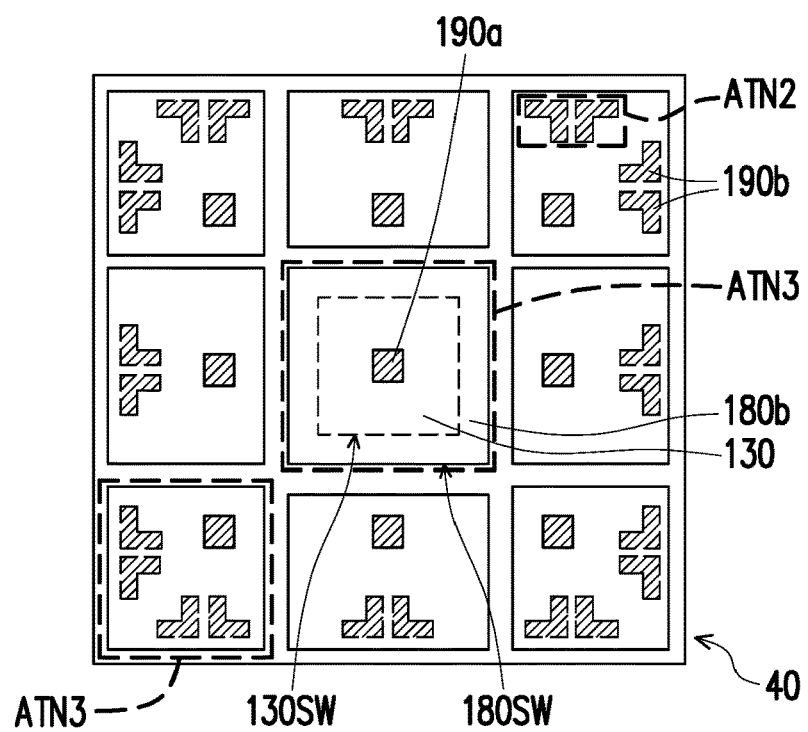
FIG. 6 is a schematic top view illustrating a relative position between antenna elements and a semiconductor die of a package structure according to some exemplary embodiments of the present disclosure.

FIG. 6 is a schematic top view illustrating a relative position between antenna elements and a semiconductor die of a package structure according to some exemplary embodiments of the present disclosure. Referring to FIG. 5A and FIG. 6, the package structure 30A depicted in FIG. 5A and the package structure 40 depicted in FIG. 6 are similar; such that the elements similar to or substantially the same as the elements described above will use the same reference numbers, and certain details or descriptions of the same elements and the relationship thereof (e.g. the relative positioning configuration and electrical connection) will not be repeated herein. Referring to FIG. 5A and FIG. 6 together, the difference is that, for the package structure 40 depicted in FIG. 6, the size of the semiconductor die 130 is less than the size of the insulators 180b while the size of the metallic patterns 190a is less than the size of the insulators 180b. As shown in FIG. 6, the edges 180SW of the antenna elements ATN3 are aside of the edges 130SW of the semiconductor die 130.

In some embodiments, the antenna elements ATN1 and the antenna elements ATN3 are considered as antenna elements of a first type (e.g. patch antenna), and the antenna elements ATN2 are considered as antenna elements of a second type (e.g. dipole antenna). In an alternative embodiment (not shown), the antenna elements of the first type (e.g. the antenna elements ATN1, the antenna elements ATN3, or a combination thereof) and the warpage control elements WM are formed in a matrix arrangement to distribute over the redistribution circuit structure 118 in a stagger manner. In some embodiments, the antenna elements ATN1 may include one insulator 180a and two or more metallic patterns 190a, and the antenna elements ATN3 may include one insulator 180b and two or more metallic patterns 190a. The disclosure is not limited thereto.

According to some embodiments, a package structure includes a redistribution circuit structure, at least one semiconductor die, an insulating encapsulation, insulators, and metallic patterns. The at least one semiconductor die is located on and electrically connected to the redistribution circuit structure. The insulating encapsulation encapsulates the at least one semiconductor die and located on the redistribution circuit structure. The insulators are located on the redistribution circuit structure, wherein the insulators are separated and spaced apart from each other, wherein edges of each of the insulators are distant from edges of the at least one semiconductor die by an offset in a stacking direction of the redistribution circuit structure and the insulating encapsulation. Each of the metallic patterns is located on a respective one of the insulators.

According to some embodiments, a manufacturing method of a package structure is provided with the following steps, forming a first redistribution circuit structure on a carrier; disposing at least one semiconductor die on a first side of the first redistribution circuit structure; forming through vias on the first side of the first redistribution circuit structure and aside of the at least one semiconductor die, wherein the through vias are electrically connected to the first redistribution circuit structure; encapsulating the at least one semiconductor die and the through vias in an insulating encapsulation; forming a second redistribution circuit structure on the insulating encapsulation, wherein the second redistribution circuit structure is electrically connected to the at least one semiconductor die and the through vias; and forming first antenna elements on a second side of the first redistribution circuit structure, the first antenna elements being mechanically separated and spaced apart from each other and each comprising an insulator and a metallic pattern disposed thereon, wherein edges of the first antenna elements are aside of edges of the at least one semiconductor die along a direction perpendicular to a stacking direction of the first redistribution circuit structure and the insulating encapsulation, and the second side is opposite to the first side.

According to some embodiments, a manufacturing method of a package structure is provided with the following steps, forming first antenna elements including providing an insulating material layer, forming metallic patterns on the insulating material layer, and cutting the insulating material layer into individual and separate insulators to form the first antenna elements, wherein each of the first antenna elements has one of the insulators and a respective one of the metallic patterns disposed thereon; forming a redistribution circuit structure; disposing at least one semiconductor die on the redistribution circuit structure, wherein the at least one semiconductor die is electrically connected to the redistribution circuit structure; encapsulating the at least one semiconductor die in an insulating encapsulation; and disposing the first antenna elements on the redistribution circuit structure, wherein the redistribution circuit structure is electrically coupled to the first antenna elements and located between the at least one semiconductor die and the first antenna elements, and wherein edges of each of the first antenna elements are distant from edges of the at least one semiconductor die by an offset in a stacking direction of the redistribution circuit structure and the insulating encapsulation.

According to some embodiments, a package structure includes a redistribution circuit structure, at least one semiconductor die, insulators and metallic patterns. The at least one semiconductor die is located on and electrically connected to the redistribution circuit structure. The insulators are located on the redistribution circuit structure, wherein the insulators are separated and spaced apart from each other, wherein edges of each of the insulators are distant from edges of the at least one semiconductor die by an offset in a stacking direction of the redistribution circuit structure and the at least one semiconductor die. The metallic patterns each are located on a respective one of the insulators, wherein the metallic patterns are electrically connected to the redistribution circuit structure in a manner of directly electrical couple.

According to some embodiments, a method of manufacturing a package structure includes the following steps: forming a first redistribution circuit structure; disposing at least one semiconductor die on a first side of the first redistribution circuit structure; and forming first antenna elements on a second side of the first redistribution circuit structure, the first antenna elements being mechanically separated and spaced apart from each other and each comprising an insulator and a metallic pattern disposed thereon, and the metallic patterns of the first antenna elements are electrically connected to the first redistribution circuit structure in a manner of directly electrical couple, wherein edges of the first antenna elements are aside of edges of the at least one semiconductor die along a direction perpendicular to a stacking direction of the first redistribution circuit structure and the at least one semiconductor die, and the second side is opposite to the first side.

According to some embodiments, a method of manufacturing a package structure includes the following steps: forming first antenna elements including providing an insulating material layer, forming metallic patterns on the insulating material layer, and cutting the insulating material layer into individual and separate insulators to form the first antenna elements, wherein each of the first antenna elements has one of the insulators and a respective one of the metallic patterns disposed thereon; forming a redistribution circuit structure, the redistribution circuit structure being electrically connected to the metallic patterns in a manner of directly electrical couple; disposing at least one semiconductor die on the redistribution circuit structure, wherein the at least one semiconductor die is electrically connected to the redistribution circuit structure; and disposing the first antenna elements on the redistribution circuit structure, wherein the redistribution circuit structure is electrically coupled to the first antenna elements and located between the at least one semiconductor die and the first antenna elements, and wherein edges of each of the first antenna elements are distant from edges of the at least one semiconductor die by an offset in a stacking direction of the redistribution circuit structure and the at least one semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a redistribution circuit structure;
   at least one semiconductor die, located on and electrically connected to the redistribution circuit structure;
   insulators, located on the redistribution circuit structure, wherein the insulators are separated and spaced apart from each other through an air gap, wherein edges of each of the insulators are distant from edges of the at least one semiconductor die by an offset in a stacking direction of the redistribution circuit structure and the at least one semiconductor die; and
   metallic patterns, each located on a respective one of the insulators, wherein the metallic patterns are electrically connected to the redistribution circuit structure in a manner of directly electrical couple.

2. The package structure of claim 1, wherein a size of each of the metallic patterns is less than or substantially equal to a size of the respective one of the insulators in the stacking direction.

3. The package structure of claim 1, wherein the insulators are located within a positioning location of the at least one semiconductor die in the stacking direction.

4. The package structure of claim 1, wherein a number of the insulators is greater than a number of the metallic patterns, and the insulators are distributed over a surface of the redistribution circuit structure.

5. The package structure of claim 4, wherein a portion of the insulators having the metallic patterns distributed thereon and a portion of the insulators without the metallic patterns distributed thereon are arranged in a form of a matrix with a stagger manner on a surface of the redistribution circuit structure.

6. The package structure of claim 1, further comprising:
an insulating encapsulation, encapsulating the at least one semiconductor die and located on the redistribution circuit structure; and
through vias, encapsulated in the insulating encapsulation and electrically connected to the at least one semiconductor die, wherein the through vias are disposed aside of a location of the at least one semiconductor die, and the edges of each of the insulators are distant from edges of each of the through vias in the stacking direction.

7. The package structure of claim 6, further comprising:
second antenna elements, encapsulated in the insulating encapsulation and electrically connected to the at least one semiconductor die, wherein the second antenna elements are disposed aside of a location of the at least one semiconductor die, and the edges of each of the insulators are distant from edges of each of the second antenna elements in the stacking direction.

8. The package structure of claim 7, wherein the second antenna elements are arranged along edges of the package structure.

9. A method of manufacturing a package structure, comprising:
forming a first redistribution circuit structure;
disposing at least one semiconductor die on a first side of the first redistribution circuit structure; and
forming first antenna elements on a second side of the first redistribution circuit structure, the first antenna elements each comprising an insulator and a metallic pattern disposed thereon, the insulators of the first antenna elements are separated and spaced apart from each other through an air gap, and the metallic patterns of the first antenna elements are electrically connected to the first redistribution circuit structure in a manner of directly electrical couple, wherein edges of the insulators of the first antenna elements are aside of edges of the at least one semiconductor die along a direction perpendicular to a stacking direction of the first redistribution circuit structure and the at least one semiconductor die by an offset, and the second side is opposite to the first side.

10. The method of claim 9, wherein the first antenna elements are formed in a matrix arrangement to distribute over the first redistribution circuit structure.

11. The method of claim 9, wherein the first antenna elements are formed in a matrix arrangement within a positioning location of the at least one semiconductor die in the stacking direction.

12. The method of claim 9, wherein forming the first antenna elements on the first redistribution circuit structure further comprises forming warpages control elements on the second side of the first redistribution circuit structure, wherein the warpage control elements are mechanically separated and spaced apart from each other and from the first antenna elements.

13. The method of claim 12, wherein the first antenna elements and the warpage control elements are formed in a matrix arrangement to distribute over the first redistribution circuit structure in a stagger manner.

14. The method of claim 12, wherein the first antenna elements are formed in a matrix arrangement within a positioning location of the at least one semiconductor die in the stacking direction, and wherein the warpage control elements are formed in a matrix arrangement outside the positioning location of the at least one semiconductor die.

15. The method of claim 12,
wherein a portion of the first antenna elements is formed in a matrix arrangement within a positioning location of the at least one semiconductor die in the stacking direction, and
wherein other portion of the first antenna elements and the warpage control elements are formed in a matrix arrangement to distribute over the first redistribution circuit structure outside the positioning location of the at least one semiconductor die in a stagger manner.

16. The method of claim 9, further comprising:
forming through vias on the first side of the first redistribution circuit structure and aside of the at least one semiconductor die, wherein the through vias are electrically connected to the first redistribution circuit structure;
encapsulating the at least one semiconductor die and the through vias in an insulating encapsulation;
forming a second redistribution circuit structure on the insulating encapsulation, wherein the second redistribution circuit structure is electrically connected to the at least one semiconductor die and the through vias; and
disposing conductive elements on the second redistribution circuit structure, wherein the second redistribution circuit structure is located between the insulating encapsulation and the conductive elements.

17. The method of claim 16, after disposing the conductive elements on the second redistribution circuit structure and prior to forming the first antenna elements on the first redistribution circuit structure, further comprising:
debonding the carrier from the first redistribution circuit structure; and
mounting the conductive elements into a polymer film, wherein the conductive elements are embedded into the polymer film.

18. A method of manufacturing a package structure, comprising:
forming first antenna elements, comprising:
providing an insulating material layer;
forming metallic patterns on the insulating material layer; and
cutting the insulating material layer into individual and separate insulators to form the first antenna elements, wherein each of the first antenna elements has one of the insulators and a respective one of the metallic patterns disposed thereon;
forming a redistribution circuit structure, the redistribution circuit structure being electrically connected to the metallic patterns in a manner of directly electrical couple;
disposing at least one semiconductor die on the redistribution circuit structure, wherein the at least one semiconductor die is electrically connected to the redistribution circuit structure; and
disposing the first antenna elements on the redistribution circuit structure, the insulators of the first antenna elements being separated and spaced apart from each other through an air gap, wherein the redistribution circuit structure is electrically coupled to the first antenna elements and located between the at least one semiconductor die and the first antenna elements, and wherein edges of each of the insulators of the first antenna elements are distant from edges of the at least one semiconductor die by an offset in a stacking direction of the redistribution circuit structure and the at least one semiconductor die.

19. The method of claim 18, wherein forming the first antenna elements further comprises forming warpage control elements, and wherein disposing the first antenna elements on the redistribution circuit structure further comprises disposing the warpage control elements on the redistribution circuit structure, and edges of each of the warpage control elements are distant from the edges of the at least one semiconductor die in the stacking direction.

20. The method of claim 18, further comprising:
forming through vias on the redistribution circuit structure and aside of the at least one semiconductor die, the through vias being electrically connected to the redistribution circuit structure; and
encapsulating the at least one semiconductor die and the through vias in an insulating encapsulation,
wherein the edges of each of the first antenna elements are distant from edges of the through vias in the stacking direction.

* * * * *